(12) United States Patent
Hussain

(10) Patent No.: US 8,531,225 B1
(45) Date of Patent: Sep. 10, 2013

(54) CONFIGURABLE CRITICAL PATH EMULATOR

(75) Inventor: Adil Hussain, Methuen, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 8 days.

(21) Appl. No.: 13/474,717

(22) Filed: May 18, 2012

(51) Int. Cl.
*H03K 3/00* (2006.01)
(52) U.S. Cl.
USPC .......................................... 327/276; 327/277
(58) Field of Classification Search
USPC .................. 327/261–262, 269–272, 276–278
See application file for complete search history.

(56) References Cited

U.S. PATENT DOCUMENTS

| 6,510,191 B2 * | 1/2003 | Bockelman | 375/371 |
| 2013/0117582 A1 * | 5/2013 | Satyamoorthy et al. | 713/300 |
| 2013/0117589 A1 * | 5/2013 | Satyamoorthy et al. | 713/320 |

* cited by examiner

*Primary Examiner* — An Luu
(74) *Attorney, Agent, or Firm* — Winston Hsu; Scott Margo

(57) ABSTRACT

The subject matter of this application is embodied in an apparatus that includes a configurable delay circuit comprising a plurality of delay elements, and a lookup table having information for configuring the delay circuit based on one or more conditions. The apparatus also includes a controller to configure the delay circuit according to the information in the lookup table, and a sampling circuit to sample outputs of each of a subset of the delay elements and generate a multi-bit delay signal providing information about an amount of delay caused by the delay elements to an input signal propagating through the configurable delay circuit. Each bit in the multi-bit delay signal indicates whether the input signal has propagated through a corresponding delay element.

26 Claims, 18 Drawing Sheets

CONFIGURABLE CRITICAL PATH EMULATOR

BACKGROUND

The present disclosure relates generally to voltage scaling architecture on system-on-chip platform.

Different integrated circuit (IC) chips that include the same circuitry can perform differently, for example, due to innate variations in the fabrication process, voltage supply variations, voltages and temperature conditions (condition (often referred to in a combined way as PVT), with P, V, and T denoting process, voltage, and temperature, respectively). IC chips can be characterized and classified into several categories (e.g., typical, fast, slow, etc.) depending on the frequencies that the chips can operate at. Characterization of IC chips includes determining frequency-voltage characteristics for each of the categories. The frequency voltage characteristics provide information on voltage requirements to operate at a given frequency for a particular category of IC chips. The frequency-voltage characteristics corresponding to the category of a given IC chip is made available to a system that includes the chip such that the system can determine the operating voltage of the chip for various frequencies.

SUMMARY

In one aspect, the disclosure features an apparatus that includes a configurable delay circuit comprising a plurality of delay elements, and a lookup table having information for configuring the delay circuit based on one or more conditions. The apparatus also includes a controller to configure the delay circuit according to the information in the lookup table, and a sampling circuit to sample outputs of each of a subset of the delay elements and generate a multi-bit delay signal providing information about an amount of delay caused by the delay elements to an input signal propagating through the configurable delay circuit. Each bit in the multi-bit delay signal indicates whether the input signal has propagated through a corresponding delay element.

In another aspect, the disclosure features an apparatus that includes a data processor, and a configurable delay circuit that includes a plurality of delay elements. Different combinations of the delay elements represent different delay paths in the configurable delay circuit. The apparatus also includes a sampling circuit to sample outputs of each of a subset of the delay elements and generate multi-bit delay signals providing information about delays caused by the delay elements to input signals propagating through the configurable delay circuit. The apparatus further includes a calibration module to evaluate each of a plurality of combinations of the delay elements based on the multi-bit delay signals and identify one or more combinations of the delay elements for emulating one or more critical paths of the data processor at various conditions.

In another aspect, the disclosure features an apparatus that includes a data processor, and a configurable delay circuit that includes a plurality of multiplexers and delay elements. Different configurations of the multiplexers are associated with different delay paths that include different combinations of the delay elements. The apparatus also includes a sampling circuit to sample outputs of a subset of the delay elements associated with a delay path and generate a delay signal providing information about an amount of delay caused by the delay elements to an input signal propagating through the configurable delay circuit. The apparatus further includes a calibration module to evaluate each delay path based on the delay signals from the sampling circuit and identify the delay paths in the configurable delay circuit for emulating critical paths of the data processor at various conditions.

In another aspect, the disclosure features a method that includes calibrating a configurable delay circuit that has a plurality of delay elements. Different combinations of the delay elements represent different delay paths in the configurable delay circuit and the calibration includes evaluating a plurality of delay paths. For each delay path, input signals are sent through the delay path, gradually reducing a power supply voltage provided to a data processor and the calibration module until the data processor fails. The calibration also includes evaluating the outputs of a subset of the delay elements corresponding to the delay path when the power supply voltage is at a level that is higher, by a safety margin, than the voltage for which the data processor fails. The calibration further includes identifying the delay path as a candidate delay path if the input signal has propagated through some but not all of the subset of delay elements during a sampling time period.

In another aspect, the disclosure features a method that includes configuring a configurable delay circuit according to information in a lookup table to select a combination of delay elements to form a delay path. The configurable delay circuit includes a plurality of delay elements, and the lookup table includes information for configuring the configurable delay circuit for various conditions. The method also includes sampling outputs of a subset of the delay elements associated with the delay path to generate a multi-bit delay signal providing information about an amount of delay caused by the delay elements to an input signal propagating through the delay path. Each bit in the multi-bit delay signal indicates whether the input signal has propagated through a corresponding delay element.

The configurable delay circuit can be configured to emulate at least one critical path in a data processor. The sampling circuit can include sampling elements that are associated with the subset of the delay elements. Each sampling element can correspond to one of the delay elements in the subset, and the multi-bit delay signal can be generated based on the outputs of the sampling elements. A power supply can be used to provide power to the configurable delay circuit, and a voltage regulator can be used to regulate a voltage level provided by the power supply. The controller can control the voltage regulator to regulate the power supply voltage level according to the multi-bit delay signal. The sampling circuit can sample the output of the subset of delay elements at a sampling time point, and the controller can control the voltage regulator to regulate the power supply voltage level such that the input signal propagates through approximately half of the subset of the delay elements at the sampling time point. The controller can control the voltage regulator to regulate the power supply voltage level such that approximately half of the bits in the multi-bit signal is 1 and half of the bits in the multi-bit signal is 0 at the sampling time point. The sampling circuit can include latches to latch the output of the subset of the delay elements. The latches can operate according to a clock signal, and the sampling time point can correspond to an edge of the clock signal. The controller can control an output voltage level of the power supply according to the multi-bit delay signal provided by the sampling circuit.

One or more of the apparatuses described above can include a data processor, and a power supply to provide power to the data processor and the configurable delay circuit. A voltage regulator can be used to regulate a voltage level provided by the power supply, wherein the look-up table also has target voltage values each corresponding to one or more conditions, and the controller at various time points can control the voltage regulator based on target voltage values obtained from the look-up table. In between the time points, the controller can control the voltage regulator based on multi-bit delay signals provided by the sampling circuit. The plurality of logic elements can include at least one of an AND gate, an OR gate, a NAND gate, a NOR gate, an XOR gate, a multiplexer, an inverter, or a logic circuit that includes at least two logic gates. The configurable delay circuit can include multiplexers to select combinations of logic gates, and the lookup table has information for configuring the multiplexers for various conditions.

The calibration module can be configured to identify candidate combinations of the delay elements in which at the power supply voltage level higher, by the safety margin, than the voltage level at which the data processor fails, the input signal has propagated through some, but not all, of the subset of delay elements during a sampling time period. When there are more than one candidate, the calibration module is configured to identify a candidate that tracks at least one of temperature or frequency better than the other candidates. The lookup table can be configured to store information for configuring the configurable delay circuit based on one or more conditions, the information being determined based on the evaluation performed by the calibration module.

In another aspect, this application features an apparatus that includes a data processor, and two or more hardware monitors to measure parameters associated with the data processor. The apparatus also features a power supply to provide power to the data processor and the hardware monitors, and a controller to control the power supply to adjust an output voltage level of the power supply according to measurements from the hardware monitors. Different weight values are applied to the hardware monitors under different conditions, and the power supply output voltage level is controlled according to weighted measurements or values derived from the weighted measurements.

In another aspect, the disclosure features a mobile device that includes a data processor, and two or more hardware monitors to measure parameters associated with different portions of the data processor. The mobile device also includes a power supply to provide power to the data processor and the hardware monitors and a look-up table having target voltage values, sets of weight values, and sets of preset parameter values. Each target voltage value, set of weight values, and set of preset parameter values corresponds to one or more conditions. The mobile device further includes a controller to use open loop control to control an output voltage level of the power supply based on the target voltage values obtained from the look-up table. The controller uses closed loop control to control the output voltage level of the power supply based on feedback provided by the hardware monitors. The weight values obtained from the look-up table are applied to differences between measurement values from the hardware monitors and the preset parameter values, and the controller controls the output voltage level of the power supply to reduce a sum of the weighted difference values.

In another aspect, the disclosure features a method that includes using a power supply to provide power to a data processor, measuring parameters associated with the data processor using two or more hardware monitors and generating measured parameter values. The method also includes determining differences between the measured parameter values and preset parameter values, applying weights to the differences, and adjusting the power supply output voltage level according to the weighted differences.

In another aspect, the disclosure features a method of operating a mobile device. The method includes providing power to a data processor by using a power supply, using the data processor to execute an application program, and reducing power consumption of the data processor. The power consumption is reduced by using an adaptive voltage scaling process that includes measuring parameters associated with the data processor using two or more hardware monitors, generating measured parameter values, and determining differences between the measured parameter values and preset parameter values. The process further includes selecting weight values according to one or more conditions, applying the weight values to the differences, and adjusting the power supply output voltage level according to the weighted differences.

In another aspect, the disclosure features a method that includes measuring parameters associated with a data processor using at least a first hardware monitor and a second hardware monitor. The method also includes determining that the first hardware monitor more closely emulates a critical path of the data processor under a first condition, and that the second hardware monitor more closely emulates a critical path of the data processor under a second condition. The method further includes assigning a first weight value to the first hardware monitor and a second weight value to the second monitor when in the first condition, the first weight value being larger than the second weight value. The method also includes assigning a third weight value to the first hardware monitor and a fourth weight value to the second monitor when in the second condition, the third weight value being smaller than the fourth weight value, and storing the first, second, third, and fourth weight values in a look-up table.

Implementations can include one or more of the following. The conditions can include at least one of clock frequency, supply voltage drops, temperature, silicon age, or process skew. The apparatus can include a look-up table having sets of weight values and preset values for the parameters, each set of weight values and preset values corresponding to one or more conditions. The controller can apply the weight values to differences between measurements from the hardware monitors and corresponding preset values, and control the power supply to adjust an output voltage level of the power supply according to the weighted difference values. The controller can control the output voltage level of the power supply to reduce a sum of the weighted difference values. The controller can apply the weight values to measurements from the hardware monitors, determine differences between the weighted measurements and corresponding preset values, and control the power supply to adjust an output voltage level of the power supply according to the difference values. The controller can control the output voltage level of the power supply to reduce a sum of the difference values. Each preset value can represent a desired parameter value measured by a hardware monitor associated with the preset value. A first set of weight values and a first set of preset values for the parameters can correspond to a first frequency or frequency range, and a second set of weight values and a second set of preset values for the parameters can correspond to a second frequency or frequency range. When the data processor operates at the first frequency or frequency range, the controller can apply the first set of weight values to differences between measured parameter values and the first set of preset values, and control the power supply output voltage level to reduce a sum of the weighted differences. When the data processor operates at the second frequency or frequency range, the controller can apply the second set of weight values to differences between measured parameter values and the first set of preset values, and control the power supply output voltage level to reduce a sum of the weighted differences. The hardware monitors can include critical path emulators that emulate critical paths of the data processor. A hardware monitor can include a delay circuit, the corresponding preset value including a circuit delay value. One of the hardware monitors can include a ring oscillator, and the corresponding preset value can include an oscillation frequency value. The controller can apply a higher weight value to a hardware monitor that is closer to timing failure than another hardware monitor that is farther from timing failure. The controller can dynamically apply different weights to the hardware monitors depending on the timing margins of the hardware monitors. The controller can identify a hardware monitor that has the smallest timing margin, identify other hardware monitors having timing margins that are within the smallest timing margin multiplied by a predetermined value, and adjust the output voltage level of the power supply according to measurements from the identified hardware monitors. Equal weight values can be applied to the identified hardware monitors, and zero weight can be applied to the hardware monitors other than the identified hardware monitors. The controller can obtain measurements from different hardware monitors at different frequencies. The controller can determine a difference between the measurement from each hardware monitor and a corresponding preset value, and sample the hardware monitor more frequently if the difference is equal to or less than a threshold, and sample the hardware monitor less frequently if the difference is greater than the threshold. The controller can reduce a sampling rate of a hardware monitor if a performance margin of the hardware monitor is greater than a first threshold and a rate of change of the power supply output voltage level is less than a second threshold. Different hardware monitors can measure properties associated with different portions of the data processor. One of the hardware monitors can measure a parameter associated with a cache memory in the data processor, and another one of the hardware monitors can measure a parameter associated with a circuit path outside of the cache memory in the data processor. For one of the conditions, the weight values can be configured such that one of the hardware monitors is given full weight and the other hardware monitor or monitors are given zero weight.

When the conditions change, the controller can obtain new weight values from the look-up table and apply the new weight values to the differences. The mobile device can include at least one of a mobile phone, a tablet computer, a laptop computer, a portable audio player, a portable video player, or a digital camera. The weight values can be obtained from a look-up table, the look-up table having sets of weight values that correspond to various conditions. The power supply can be controlled to achieve an output voltage level according to a pre-stored voltage value obtained from the lookup table, and then using the adaptive voltage scaling process to optimize the power supply output voltage level. A method can include determining which one of a first voltage-delay characteristic of a first hardware monitor or a second voltage-delay characteristic of a second hardware monitor more closely matches a voltage-delay characteristic of a critical path of the data processor under various conditions.

In another aspect, the disclosure features an apparatus that includes a data processor, at least one hardware monitor to measure circuit delays associated with the data processor and a power supply to provide power to the data processor. The apparatus also includes a voltage regulator to regulate a voltage level provided by the power supply, and a look-up table having target voltage values and target circuit delay values each corresponding to one or more conditions. The apparatus further includes a controller to control the voltage regulator. The controller at various time points controls the voltage regulator based on target voltage values obtained from the look-up table. In between the time points, the controller controls the voltage regulator based on differences between target circuit delay values and measured circuit delay values.

In another aspect, the disclosure features an apparatus that includes a circuit and a hardware monitor to measure circuit delays associated with the circuit. The apparatus also includes a regulated power supply to provide power to the circuit, and a look-up table having target voltage values and target circuit delay values. The apparatus further includes a controller to control the regulated power supply based on open loop control and closed feedback loop control. For the open loop control the controller sets the regulated power supply voltage based on target voltage values obtained from the look-up table. For the closed feedback loop control, the controller continuously adjusts the regulated power supply voltage based on differences between target circuit delay values and measured circuit delay values.

In another aspect, the disclosure features an apparatus that includes a data processor, a data bus, and a plurality of hardware monitors to measure circuit delays associated with the data processor, the hardware monitors being coupled to the data bus. The apparatus also includes a power supply to provide power to the data processor, a voltage regulator to regulate the voltage level provided by the power supply, and a look-up table having target voltage values and target circuit delay values each corresponding to one or more conditions. The apparatus also features a controller to control the voltage regulator based on the target voltage values and the target circuit delay values in the look-up table and measured circuit delay values. The controller polls the hardware monitors and receives measured circuit delay values from the hardware monitors through the data bus.

In another aspect, the disclosure features a method that includes transmitting data on a data bus to a data processor, measuring circuit delays associated with the data processor using hardware monitors coupled to the data bus and sending, from a controller, requests to the hardware monitors through the data bus, the requests requesting measured circuit delay values. The method also includes receiving, at the controller, measured circuit delay values from the hardware monitors through the data bus, and controlling, using the controller, an output voltage level of a power supply that provides power to the data processor according to the measured circuit delay values.

Implementations can include one or more of the following. The controller can obtain new target voltage values and target circuit delay values from the look-up table when the conditions change. The one or more conditions can include at least one of clock frequency or temperature. The controller can calculate a step voltage based on the difference between the target circuit delay value and the measured circuit delay value, and provide the step voltage to the voltage regulator for use in incremental adjustment of the power supply output voltage level. The controller, after providing the step voltage to the voltage regulator, can wait an amount of time that is determined based on the step voltage before sampling the measured circuit delay value again. The wait time can be longer when the step voltage is larger. A stability controller can be used to reduce overshoot and undershoot of the output voltage of the power supply as the voltage regulator incrementally adjusts the power supply output voltage based on the step voltages provided by the controller. The circuit delays measured by the hardware monitor can be associated with at least one critical path in the data processor. The look-up table can be sorted in ascending or descending order, and the controller can search the look-up table using a binary search when attempting to obtain values from the look-up table. The conditions can include clock frequency, process, and temperature, and the entries can be sorted according to clock frequency values, process values, and temperature values.

In the closed feedback loop control, the controller calculates a step voltage based on the difference between the target circuit delay value and the measured circuit delay value, and adjusts the regulated power supply voltage based on the step voltage. The controller, after adjusting the regulated power supply voltage based on the step voltage, can wait an amount of time that is determined based on the step voltage before sampling the measured circuit delay value again.

The hardware monitor can have a unique identifier. The controller polls a particular hardware monitor by sending the unique identifier on the data bus, and the particular hardware monitor responds to the controller upon identifying the unique identifier on the data bus. The voltage regulator can be coupled to the data bus, and the controller can send commands for increasing or decreasing voltage to the voltage regulator through the data bus. The data processor can be coupled to the data bus, and the data processor can access resources coupled to the data bus. The a controller can be configured to poll at least one hardware monitor to obtain at least one measured circuit delay value, calculate a step voltage based on a difference between a target circuit delay value and the at least one measured circuit delay value, provide the step voltage to the voltage regulator for use in adjusting the power supply voltage level, and wait an amount of time that is determined based on the step voltage before polling a hardware monitor to request a new measured circuit delay value.

The amount of traffic on the data bus associated with the hardware monitors can be reduced by having the controller wait an amount of time before sending another request to the hardware monitors. The amount of time can be determined based on a step voltage used to incrementally adjust the output voltage level of the power supply. The controller can wait for a longer period of time when the step voltage is larger.

In another aspect, the disclosure features an apparatus that includes a data processor, and a hardware monitor to emulate a critical path of the data processor and measure a parameter associated with the emulated critical path, process the measurement value, and generate an interrupt signal if the processing result meets a criterion. The apparatus also includes a power supply to provide power to the data processor and the hardware monitor, and a controller to receive the interrupt signal from the hardware monitor and in response to the interrupt signal, controls the power supply to adjust an output voltage level of the power supply.

In another aspect, the disclosure features an apparatus that includes a data processor, and a hardware monitor to measure a parameter associated with the data processor, process the measurement value, and generate an interrupt signal if the processing result meets a criterion. The apparatus also includes a power supply to provide power to the data processor and the hardware monitor, and a controller to receive the interrupt signal from the hardware monitor and in response to the interrupt signal, controls the power supply to adjust an output voltage level of the power supply.

In another aspect, the disclosure features a mobile device that includes a data processor, a data bus, and a hardware monitor to measure a parameter associated with the data processor. The hardware monitor is coupled to the data bus, and is configured to process the measurement value and generate an interrupt signal if the processing result meets a criterion. The mobile device also includes a power supply to provide power to the data processor and the hardware monitors, a look-up table having target voltage values and preset parameter values, in which each target voltage value and preset parameter value corresponds to one or more conditions, and a controller to use open loop control to control an output voltage level of the power supply based on the target voltage values obtained from the look-up table. In addition, the controller uses closed loop control to control the output voltage level of the power supply based on feedback provided by the hardware monitor. When using the closed loop control, the controller receives the interrupt signal from the hardware monitor, and in response to the interrupt signal, adjusts the power supply output voltage level.

In another aspect, the disclosure features a method that includes providing power to a data processor by using a power supply, measuring a parameter associated with the data processor using a hardware monitor, and processing the measurement and generating an interrupt signal at the hardware monitor if the processing result meets a criterion. The method also includes, upon receiving the interrupt signal at the controller, controlling the power supply to adjust the power supply output voltage level.

In another aspect, the disclosure features a method of operating a mobile device, the method including providing power to a data processor by using a power supply, using the data processor to execute an application program, and reducing power consumption of the data processor by using an adaptive voltage scaling process. The adaptive voltage scaling process includes measuring a parameter associated with the data processor using a hardware monitor, sending measurement values from the hardware monitor to a controller through a data bus, and using the controller to control the power supply to adjust the power supply output voltage level according to the measurement values. The method also includes reducing the amount of bus bandwidth used by the transmission of the measurement values from the hardware monitor to the controller by processing the measurement values at the hardware monitor and sending the measurement values to the controller if the processing results meet a criterion.

Implementations can include one or more of the following. The controller can query the hardware monitor to obtain a measurement of the parameter and control the power supply according to the measurement value. The hardware monitor can compare the measurement value with a preset parameter value, and generate the interrupt signal if a difference between the measurement value and the preset value is above a threshold. The hardware monitor can compare the measurement value with an upper threshold value and generate an interrupt signal if the measurement value is greater than the upper threshold value. The controller, upon receiving the interrupt signal and obtaining the measurement value, can adjust the power supply to decrease the power supply output voltage level by a predetermined amount. The controller, upon receiving the interrupt signal and obtaining the measurement value, can calculates an amount of voltage reduction based at least in part on the measurement value, and adjust the power supply to reduce the power supply output voltage level by the calculated amount. The hardware monitor can compare the measurement value with a lower threshold value and generate an interrupt signal if the measurement value is below the lower threshold value. The controller, upon receiving the interrupt signal and obtaining the measurement value, can adjust the power supply to increase the power supply output voltage level by a predetermined amount. The controller, upon receiving the interrupt signal and obtaining the measurement value, can calculate an amount of voltage increase based at least in part on the measurement value, and adjust the power supply to increase the power supply output voltage level by the calculated amount. The hardware monitor can measure the parameter at a frequency that is higher than a frequency at which the controller is able to repeatedly adjust the power supply output voltage level. The parameter measured by the hardware monitor can include a circuit delay, and the controller can control the power supply output voltage level to reduce a difference between a measured circuit delay and a preset circuit delay value. The parameter measured by the hardware monitor can also include an oscillation frequency of a ring oscillator, and the controller can control the power supply output voltage level to reduce a difference between a measured oscillation frequency and a preset oscillation frequency value. The hardware monitor can measure a timing margin, and the controller can control the power supply output voltage level to adjust the timing margin to within a specified range. A look-up table having preset values for the parameters can be used, each preset value corresponding to one or more conditions. The conditions can include at least one of clock frequency, supply voltage drops, temperature, silicon age, or process skew. Each preset value can represent a desired parameter value measured by the hardware monitor for a given condition. The controller can control the power supply to reduce a difference between the measured parameter value and a corresponding preset value.

In some cases, a plurality of hardware monitors can be used, each hardware monitor being configured to repeatedly measure a parameter associated with the data processor, process the measurements, and generate interrupt signals based on the processing of the measurements. The controller, upon receiving two or more interrupt signals from the hardware monitors, can query one of the hardware monitors that has sent an interrupt signal to obtain a measurement value from the hardware monitor, and adjust the power supply output voltage level according to the measurement value. The controller, upon receiving two or more interrupt signals from the hardware monitors, can query all of the hardware monitors that have sent interrupt signals to obtain measurements of the parameters from the hardware monitors, and adjust the power supply output voltage level according to the measurement values. The controller can controls the power supply to adjust the output voltage level based on information in the interrupt signal. The interrupt signal can include multiple bits in which a first bit pattern indicates that the output voltage level should be increased, and a second bit pattern indicates that the output voltage level should be decreased. The controller can cause the power supply to increase or decrease the output voltage level by a predetermined amount based on the information in the interrupt signal.

The controller can query the hardware monitor to obtain a measurement of the parameter and control the power supply according to the measurement value. The hardware monitor can generate an interrupt signal if the measurement value is greater than an upper threshold value or below a lower threshold value. The hardware monitor can include a critical path emulator that emulates a critical path of the data processor, and the parameter being measured is associated with a timing margin of the critical path.

The controller can query the hardware monitor to obtain, through the data bus, a measurement value of the parameter from the hardware monitor and adjust the output voltage level to reduce a difference between the measured parameter value and a corresponding preset parameter value. Upon a change in the clock frequency, supply voltage drops, temperature, or silicon age, the controller can obtain a new target voltage value from the look-up table for use in the open loop control, and obtains a new preset parameter value from the look-up table for use in the closed loop control. The mobile device can include at least one of a mobile phone, a tablet computer, a laptop computer, a portable audio player, a portable video player, or a digital camera. The parameter can include at least one of a timing margin of a delay circuit or an oscillation frequency of a ring oscillator.

Upon receiving the interrupt signal, the hardware monitor can be queried to obtain a measurement value of the parameter. The power supply output voltage level can be adjusted according to the measurement value. The controller can cause the power supply to increase or decrease the output voltage level by a predetermined amount based on the interrupt signal. The measurement can include comparing the measurement value with an upper threshold value and a lower threshold value. Generating the interrupt signal can include generating the interrupt signal if the measurement value is greater than the upper threshold value or below the lower threshold value. The hardware monitor can be used to emulate a critical path of the data processor, in which measuring a parameter includes measuring a parameter associated with the critical path. Controlling the power supply can include controlling the power supply to adjust the power supply output voltage level to reduce a difference between the measurement value and a parameter set point value.

At the hardware monitor, an interrupt can be sent to the controller when the measurement value is higher than an upper threshold or is below a lower threshold. At the controller, the measurement value can be requested from the hardware monitor upon receiving the interrupt. A critical path of the data processor can be emulated, in which measuring a parameter can include measuring a timing margin of the emulated critical path. The power supply can be controlled to achieve an output voltage level according to a pre-stored voltage value obtained from a lookup table, and using the adaptive voltage scaling process to optimize the power supply output voltage level. The power supply output voltage level can be adjusted to reduce a difference between the measurement value and a pre-stored parameter value obtained from a look-up table.

In another aspect, the disclosure features an apparatus that includes a data processor, and a hardware monitor. The hardware monitor can be configured to emulate a critical path of the data processor, measure a parameter associated with the emulated critical path, process the measurement value, and generate an interrupt signal if the processing result meets a criterion. The apparatus also includes a power supply to provide power to the data processor and the hardware monitor, and a controller to control the power supply to adjust an output voltage level of the power supply. The controller upon receiving an interrupt signal from the hardware monitor queries the hardware monitor to obtain a measurement of the parameter and controls the power supply to adjust the output voltage level according to the measurement value.

In another aspect, the disclosure features an apparatus that includes a data processor, and a hardware monitor to measure a parameter associated with the data processor, process the measurement value, and generate an interrupt signal if the processing result meets a criterion. The apparatus also includes a power supply to provide power to the data processor and the hardware monitor, and a controller to control the power supply to adjust an output voltage level of the power supply. The controller upon receiving the interrupt signal from the hardware monitor queries the hardware monitor to obtain a measurement of the parameter from the hardware monitor, and controls the power supply to adjust the output voltage level according to the measurement value.

In another aspect, the disclosure features a mobile device that includes a data processor, a data bus, and a hardware monitor to measure a parameter associated with the data processor. The hardware monitor is coupled to the data bus, and is configured to process the measurement value and generate an interrupt signal if the processing result meets a criterion. The apparatus also includes a power supply to provide power to the data processor and the hardware monitors, and a look-up table having target voltage values and preset parameter values. Each target voltage value and preset parameter value corresponds to one or more conditions. The apparatus further includes a controller to use open loop control to control an output voltage level of the power supply based on the target voltage values obtained from the look-up table, and to use closed loop control to control the output voltage level of the power supply based on feedback provided by the hardware monitor. When using the closed loop control, the controller waits for the interrupt signal, and upon receiving the interrupt signal from the hardware monitor, the controller queries the hardware monitor to obtain, through the data bus, a measurement value of the parameter from the hardware monitor and adjust the power supply output voltage level to reduce a difference between the measured parameter value and a corresponding preset parameter value.

In another aspect, the disclosure features a method that includes providing power to a data processor by using a power supply, and measuring a parameter associated with the data processor using a hardware monitor. The method also includes processing the measurement and generating an interrupt signal at the hardware monitor if the processing result meets a criterion. The method further includes upon receiving the interrupt signal at the controller, querying the hardware monitor to obtain a measurement value of the parameter, and controlling the power supply to adjust the power supply output voltage level according to the measurement value.

In another aspect, the disclosure features a method of operating a mobile device, the method including providing power to a data processor by using a power supply, using the data processor to execute an application program, and reducing power consumption of the data processor by using an adaptive voltage scaling process. The adaptive voltage scaling process includes measuring a parameter associated with the data processor using a hardware monitor, sending measurement values from the hardware monitor to a controller through a data bus, and using the controller to control the power supply to adjust the power supply output voltage level according to the measurement values. The method further includes reducing the amount of bus bandwidth used by the transmission of the measurement values from the hardware monitor to the controller by processing the measurement values at the hardware monitor and sending the measurement values to the controller if the processing results meet a criterion.

Implementations can include one or more of the following. The hardware monitor can compare the measurement value with a preset parameter value, and generate the interrupt signal if a difference between the measurement value and the preset value is above a threshold. The hardware monitor can compare the measurement value with an upper threshold value and generate an interrupt signal if the measurement value is greater than the upper threshold value. The controller, upon receiving the interrupt signal and obtaining the measurement value, can adjust the power supply to decrease the power supply output voltage level by a predetermined amount. The controller, upon receiving the interrupt signal and obtaining the measurement value, can calculate an amount of voltage reduction based at least in part on the measurement value, and adjust the power supply to reduce the power supply output voltage level by the calculated amount. The hardware monitor can compare the measurement value with a lower threshold value and generate an interrupt signal if the measurement value is below the lower threshold value. The controller, upon receiving the interrupt signal and obtaining the measurement value, can adjust the power supply to increase the power supply output voltage level by a predetermined amount. The controller, upon receiving the interrupt signal and obtaining the measurement value, can calculate an amount of voltage increase based at least in part on the measurement value, and adjust the power supply to increase the power supply output voltage level by the calculated amount. The hardware monitor can measure the parameter at a frequency that is higher than a frequency at which the controller is able to repeatedly adjust the power supply output voltage level. The parameter measured by the hardware monitor can include a circuit delay, and the controller can control the power supply output voltage level to reduce a difference between a measured circuit delay and a preset circuit delay value. The parameter measured by the hardware monitor can also include an oscillation frequency of a ring oscillator, and the controller can control the power supply output voltage level to reduce a difference between a measured oscillation frequency and a preset oscillation frequency value. The hardware monitor can measure a timing margin, and the controller can control the power supply output voltage level to adjust the timing margin to within a specified range. A look-up table having preset values for the parameters can be used, each preset value corresponding to one or more conditions. The conditions can include at least one of clock frequency, supply voltage drops, temperature, silicon age, or process skew. Each preset value can represent a desired parameter value measured by the hardware monitor for a given condition. The controller can control the power supply to reduce a difference between the measured parameter value and a corresponding preset value.

In some cases, a plurality of hardware monitors can be used, each hardware monitor being configured to repeatedly measure a parameter associated with the data processor, process the measurements, and generate interrupt signals based on the processing of the measurements. The controller upon receiving two or more interrupt signals from the hardware monitors, can query one of the hardware monitors that has sent an interrupt signal to obtain a measurement value from the hardware monitor, and adjust the power supply output voltage level according to the measurement value. The controller upon receiving two or more interrupt signals from the hardware monitors, can query all of the hardware monitors that have sent interrupt signals to obtain measurements of the parameters from the hardware monitors, and adjusts the power supply output voltage level according to the measurement values.

The hardware monitor can generate an interrupt signal if the measurement value is greater than an upper threshold value or below a lower threshold value. The hardware monitor can measure the parameter at a frequency that is higher than a frequency in which the controller is able to repeatedly adjust the power supply output voltage level. The hardware monitor can include a critical path emulator that emulates a critical path of the data processor, and the parameter being measured can be associated with a timing margin of the critical path.

Upon a change in the clock frequency, supply voltage drops, temperature, or silicon age, the controller can obtain a new target voltage value from the look-up table for use in the open loop control, and obtain a new preset parameter value from the look-up table for use in the closed loop control. The mobile device can include at least one of a mobile phone, a tablet computer, a laptop computer, a portable audio player, a portable video player, or a digital camera. The parameter can include at least one of a timing margin of a delay circuit or an oscillation frequency of a ring oscillator.

Processing the measurement can include comparing the measurement value with an upper threshold value and a lower threshold value, and generating the interrupt signal comprises generating the interrupt signal if the measurement value is greater than the upper threshold value or below the lower threshold value. The hardware monitor can be used to emulate a critical path of the data processor, in which measuring a parameter can include measuring a parameter associated with the critical path. Controlling the power supply can include controlling the power supply to adjust the power supply output voltage level to reduce a difference between the measurement value and a parameter set point value.

At the hardware monitor, an interrupt can be sent to the controller when the measurement value is higher than an upper threshold or is below a lower threshold. At the controller, the measurement value can be requested from the hardware monitor upon receiving the interrupt. A critical path of the data processor can be emulated, in which measuring a parameter can include measuring a timing margin of the emulated critical path. The power supply can be controlled to achieve an output voltage level according to a pre-stored voltage value obtained from a lookup table, and the adaptive voltage scaling process can be used to optimize the power supply output voltage level. Adjusting the power supply output voltage level can include adjusting the power supply output voltage level to reduce a difference between the measurement value and a pre-stored parameter value obtained from a look-up table.

DETAILED DESCRIPTION

Figure 1:
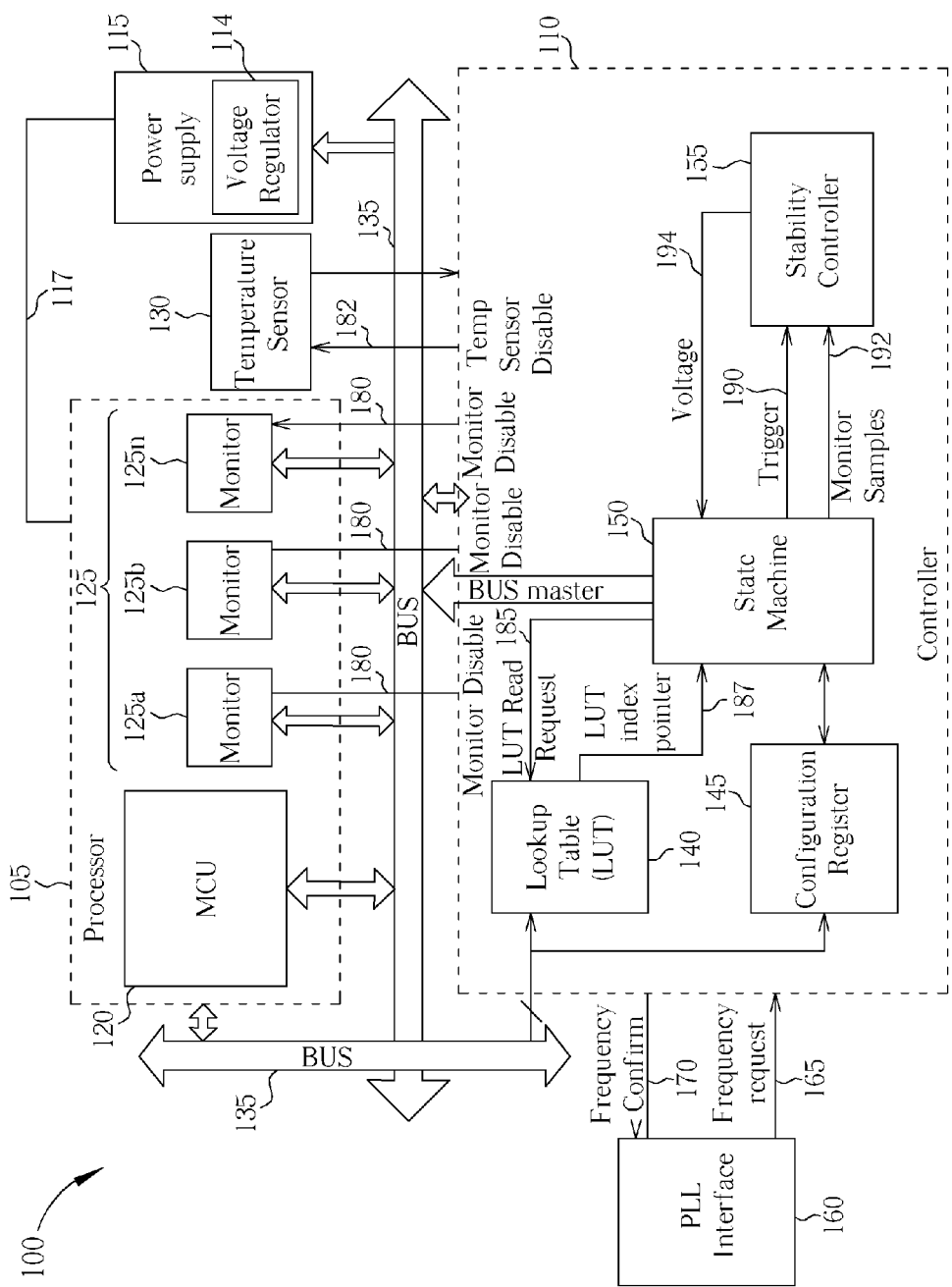
FIG. 1 is a block diagram of a system that implements adaptive voltage scaling (AVS).

Power consumption of a data processor can be reduced by operating the data processing at a voltage level that is lower than a prescribed voltage level determined based on worst-case conditions. Different integrate circuit chips of the same design may have different characteristics, due to, e.g., material and fabrication process variations. Most dynamic voltage frequency scaling (DVFS) systems use discrete operation voltage/frequency pairs, which are typically stored in look-up tables (LUT) in the integrated circuit chips. Voltages are typically selected to be sufficiently high to enable the majority of the chips to function properly. For the integrated circuit chips that can operate at lower voltages for a given clock frequency, operating the data processors according to the voltage levels prescribed by look-up tables result in wasted power. By using hardware emulators that emulate critical paths of the data processor and measuring timing or delay of the emulated critical paths, feedback information can be provided to a voltage controller for determining the lowest voltage that can be used for operating the data processor with sufficient timing margin. Such adaptive voltage scaling (AVS) reduces the power consumption of the data processor while still allowing the processor to operate properly.

For integrated circuits (ICs) such as processor chips used in computing devices, the frequency-voltage characteristics provide information about voltage requirements for given frequencies. Typically devices with such ICs are configured to run various applications and the frequency requirements are generally a function of the applications. For example, on a smartphone, video or other multimedia applications may require the smartphone to operate at a higher frequency than voice applications or messaging applications. Applications that require the processor to operate at high clock frequencies typically consume more power and therefore need a higher operating voltage. The voltage requirement for a given frequency can be determined based on the frequency-voltage characteristics for the given category of the IC (fast, slow, ultra-fast, etc.). The frequency voltage characteristics can be stored, for example as a look-up table, and accessed by the IC system to determine voltage requirements for a given frequency. However, because a given IC can exhibit variations from the typical characteristics of the corresponding category (for example, due to inherent variations in the material or fabrication processes and/or temperature variations), and because the frequency-voltage characteristics are typically determined for worst-case conditions, the given IC can sometimes be operated at lower voltages that what is prescribed by the frequency-voltage characteristics for the given category. For example, by monitoring delays in critical paths in the circuit during run-time (for example, using critical path emulators), and comparing the monitored delays to expected delays (obtained for example by pre-characterization), it may be possible to reduce operating voltages until the monitored delays are substantially equal to the expected delays. Under certain circumstances, the power consumption is proportional to the square of voltage, and so reduction in operating voltages can result in significant power savings. Such power management by adjusting the operating voltage can be referred to as voltage scaling.

In some implementations, the methods and systems described herein can exhibit one or more of the following advantages. By using a bus-based architecture, the voltage regulation system can be made scalable. Additional performance monitors can be added on the bus without making substantial changes to the rest of the architecture. The architecture can also allow for the added flexibility of selecting monitors that are close to the critical path while ignoring or assigning low weights to other monitors. The voltage regulation system continuously tracks the different monitors and adjusts the voltage based on monitor readings until there is a change in the load. By tracking and adjusting the voltage between the load changes (i.e. significant changes in frequency and/or temperature), significant power savings can be achieved during runtime. By providing a stability controller, the system can compensate for overshoot/undershoot voltage responses and also prevent adverse conditions such as runaway oscillations.

Loop response times can also be reduced using the voltage regulation methods and systems described herein. Loop response time is defined as how fast the voltage regulation system responds to changes in workload fluctuations (e.g. changes in frequency, temperature, and/or IR drops). An IR drop is a voltage drop or change across a conducting path (or any other resistive element in the circuit) and is given by the product of the current I and the corresponding resistance R. Using the methods and systems described herein, loop response time can be reduced in several ways, for example, by providing direct access to look-up table memory to reduce look-up table access time, and calculating the time between two voltage adjustments based on the amount of voltage correction performed during the first of the two adjustments. Additional power savings can also be achieved by providing supporting functionalities to handle power down requests. Such power down requests can shut down one or more portions of the voltage regulation system when not in use.

Voltage Scaling System Overview

FIG. 1 shows a block diagram of an example of a system 100 for voltage scaling. In broad overview, the system 100 includes a processor 105 and a controller 110. A power supply 115 provides supply voltage 117 to the processor 105. The power supply 115 includes a voltage regulator 114 that is controlled by the controller 110. The controller 110 is configured to receive feedback from one or more monitors 125a, 125b, . . . 125n (125 in general) that monitor operating parameters related to the processor 105, and control the supply voltage 117 accordingly. The resultant feedback loop can facilitate scaling of the supply voltage 117 to levels lower than what is provided by the frequency-voltage characteristics obtained from look-up tables, which may result in significant power savings.

The processor 105 can be of various forms and types. In some implementations, the processor 105 is a mobile processor that is used in cellular phones. The processor 105 can also be, without limitation, a processor for a desktop, laptop, tablet, e-reader, or another wired or wireless electronic device. The processor 105 can be configured to operate at different power levels based on applications that are executed by the processor. The processor 105 can also be configured to run at various clock frequencies based on the applications. For example, the processor 105 may run at a low voltage and low frequency while executing voice and short-messaging applications. However, for more complex applications such as rendering video, the processor 105 may run at a relatively higher voltage and frequency. A particular application and the corresponding operating parameters are often referred to as a load for the processor 105. In general, the processor 105 can be configured to change operating voltages and frequencies when the load changes. In some implementations, parts of the processor may also be turned off or operated in a "sleep-mode." The processor 105 can also include a power management module that can be configured to manage the operating parameters of the processor 105 based on the load. In some implementations, the processor includes one or more cores 120 (also referred to as the Master Control Unit (MCU)).

The controller 110 is provided to manage at least portions of the power management operations. The controller 110 can communicate with the voltage regulator 114 to control the supply voltage 117 supplied by the power supply 115. In some implementations, the communication between the controller 110 and the voltage regulator 114 is facilitated by a bus 135. The controller 110 can also be directly connected to the voltage regulator 114. The MCU 120 can be configured to program or store frequency voltage-characteristics of the MCU 120. For example, the frequency-voltage characteristics can be stored in a look-up table (LUT) 140. Even though FIG. 1 shows the LUT 140 as a part of the controller 110, the LUT 140 can be stored at other locations in the system 100 (for example on the processor 105, or on a separate storage device).

The controller 110 can be configured to control the voltage regulator 114 based on target voltage values obtained from the LUT 140. For example, when the processor 105 has to operate at a particular frequency, the controller 110 can control the voltage regulator 114 based on the voltage specified in the frequency-voltage characteristics stored in the LUT 140. The controller 110 can also be configured to control the voltage regulator 114 based on feedback information received from the monitors 125. For example, for a given frequency, if the processor 105 is operating at the operating voltage prescribed by the frequency-voltage characteristics, the monitors 125 can be used to measure a delay of a critical path. If the measured delay is less than the expected target delay under the operating conditions, the controller 110 can be configured to reduce the supply voltage 117. The monitors 125 can then be used again to measure the delay and the supply voltage 117 is readjusted accordingly. The controller 110 can be configured to control the voltage regulator 114 based on the feedback from the monitors 125 until the measured delay is sufficiently close (for example, as defined by a threshold condition) to the target delay. The feedback based control can be done at time points in between the LUT based controls.

When the controller 110 controls the voltage regulator 114 based only on target voltage values obtained from the LUT 140 without feedback information, this is referred to as open loop control. When the controller 110 controls the voltage regulator 114 based on feedback information, this is referred to as closed loop control. When the controller 110 controls the voltage regulator 114 based on both the target voltage values obtained from the LUT 140 and feedback information, open loop control can be used to drive the operating voltage to the target voltage value, and closed loop control can be used to optimize the operating voltage. In this case, the target voltage values obtained from the LUT 140 can be, e.g., the worst case voltage for a particular frequency, temperature, and/or process, and can be used as a starting point to allow the optimized voltage value to be reached faster using the closed loop control.

The processor 105 also includes monitors 125 for measuring one or more parameters related to on-chip conditions. The monitors 125 can also be referred to as hardware performance monitors (HPM). In some implementations, there may be only one monitor 125 disposed on a processor 105. In other cases, a plurality of monitors 125 can be used. In some implementations, the monitors 125 can be positioned on the processor core in sufficient proximity to potential critical paths such that temperature and other conditions affecting the critical paths also affect the monitors 125.

In some implementations, each of the monitors 125 includes circuitry (for example, logic gates and interconnects) that can be configured such that a delay associated with a signal to propagate through the monitor 125 is approximately or substantially equal to a delay associated with a critical path within the processor. Such monitors 125 can also be referred to as Critical Path Emulators (CPE) and are described below in details. When CPEs are used as monitors, the delay across a monitor is measured and the measured delay is compared with an expected target delay to get an indication about circuit performance. For example, if the measured delay is less than the target delay, the operating voltage can typically be reduced. On the other hand, if the measured delay exceeds the target delay, the operating voltage is typically increased. Similarly, the measured delay being sufficiently close to the target delay indicates that the operating voltage is at a substantially optimum or near-optimum level for the applications executing on the processor. Low operating voltages typically lower the drive currents of the transistor, resulting in slower speeds. However, when the transistors are already "fast" (for example, due to fast process or temperature conditions), a high voltage is often not needed to run at high frequencies. In such cases, the operating voltage can be reduced while allowing the transistors to operate at a desired frequency.

In some implementations, each of the CPEs can be configured to generate a readout that reflects the effect of one or more of a skew, voltage, temperature and other variables that affect the delay through the CPE. In some implementations, the system 100 can include different types of monitors 125. For example, one monitor 125a can be a Kogge-Stone adder whereas another monitor 125b can be a CPE or a ring oscillator. In some implementations, each of the monitors 125 can be connected to a monitor disable line 180. The controller 110 can be configured to disable one or more monitors 125 using corresponding monitor disable lines 180 without accessing the bus 135.

In some implementations, the monitors 125 can include timing error monitors. The timing error monitors are disposed within the circuit, for example, inside flip-flops, and configured to fail before the circuit. The timing error monitors can also be configured to alert the controller 110 about a potentially hazardous condition such that the supply voltage 117 can be suitably altered to ensure fault free operation.

In some implementations, when a plurality of monitors 125 is used, outputs of the individual monitors can be weighted appropriately by the controller 110. In some implementations, the outputs (for example, delays) of the individual monitors 125 can be averaged to determine a parameter used for controlling the voltage regulator 114. The outputs of the monitors 125 can also be weighted based on the location of the monitors. This is because the location of a critical path can change from one application (and/or operating frequency) to another and the weight of a particular monitor for a given application can be different from the weight for a different application. For example, if a certain monitor (for example, 125a) is known to be physically closer to a critical path for a particular application than another monitor (for example, 125b), the output of the monitor 125a can be given a higher weight than the output of the monitor 125b in determining the parameter used for controlling the controller 110 for the particular application. In some implementations, outputs from one or more of the monitors 125 can also be ignored. Even though FIG. 1 shows the monitors 125 to be disposed on the processor 105, the monitors 125 can also be disposed at other locations within the system 100, for example, on the integrated circuit and near the periphery of the processor 105, but external to the processor 105.

The system 100 can also include a temperature sensor 130. The temperature sensor 130 is configured to measure and provide information on thermal conditions of the processor 105. The temperature sensor 130 can be configured to provide a temperature related point of reference for the voltage controlled feedback loop described herein. The temperature sensor 130 can also be used to prevent adverse conditions such as thermal runaway. The information provided by the temperature sensor 130 can be used by the controller 110 in determining control parameters for the voltage regulator 114. For example, if the temperature of a particular portion of the processor 105 rises during runtime, the voltage requirement for that portion of the processor may decrease from the value provided from the look-up table LUT 140. In such cases, the temperature information can be used to determine if, and by how much the supply voltage 117 can be decreased. Both analog and digital temperature sensors can be used as a temperature sensor 130. In some implementations, the temperature sensor 130 can be connected to a temperature sensor disable line 182 that can be used by the controller 110 to disable the temperature sensor 130.

The power supply 115 provides operating power to the processor 105. In some implementations the power supply 115 may also supply operating power to other parts of the system 100 including, for example, the controller 110. In some implementations, the power supply 115 is a direct current to direct current (DC-DC) converter that converts a voltage level provided by an external source of DC to another voltage level. The power supply 115 can be controlled by the controller 110 such that the supply voltage 117 to the processor 105 can be made adjustable. When the external source is a battery (for example, batteries used in cell phones or laptop computers), the power supply 115 can be configured to provide the requisite supply voltage 117 by converting the voltage supplied by the battery. The power supply 115 can employ various methods for converting one voltage level to another including, for example, linear conversion, switched mode conversion, or magnetic conversion. The power supply 115 can be included in a power management unit (PMU). In such cases, the PMU can be connected to the processor 105 via a connection such as a power supply serial port (PSP). In some implementations, a PSP interface can facilitate efficient communications between the power supply 115 and the processor 105. In some implementations, the power supply 115 can be configured for fast response to voltage changes (for example, 5 mV/μS). The power supply 115 can also be configured to deliver fine-grained voltage resolution, for example, 5 mV/step. In some implementations, the power supply 115 can include a switching regulator such as a Buck converter.

The system 100 also includes a shared bus 135 that facilitates communications between various entities of the system 100, such as the processor 105, the controller 110 and the power supply 115. The monitors 125 are typically also connected to the bus 135. In some implementations, the controller 110 acts as a bus master and controls access to the monitors 125 as well as the power supply 115. The access latency associated with using the bus 135 is typically small. In one example, for a bus frequency of 122 MHz and where each read/write operation takes 3 cycles, the access latency is 8.1 ns×3=24.3. Because the system 100 provides several monitors 125 with a single bus master, additional monitors can be added to the system 100 without significant changes to the controller 110. This allows for a scalable architecture that can be configured with additional or fewer monitors 125 as needed. Further, because the monitors 125 can be accessed using the shared bus 135, the controller 110 can select one or more monitors as needed. Therefore, a smaller number of monitors can be used even when a larger number of monitors are available. In some implementations, the monitors 125 can also be directly connected to the controller 110 in addition to the connection of the monitors 125 to the bus 135. In some implementations, the direct connections can be used to reduce bandwidth requirements on the bus 135. A mode in which the monitors 125 are directly read without using the bus can be referred to as the IRQ mode. In the IRQ mode, the controller 110 can use information in the interrupt signals from the monitors 125 to increment/decrement the supply voltage 117, for example by a predetermined amount, instead of reading the monitor samples over the bus 135. Alternatively, the controller 110, upon receiving an interrupt, can obtain the monitor samples (either through the direct connections or over the bus 135) and calculate the necessary adjustments.

The controller 110 can be configured to track variations in frequency and/or temperature in the processor 105 and communicate with the power supply 115 to control the supply voltage 117. The voltage regulator 114 is typically configured by the controller 110. The controller 110 can include, for example, the look-up table LUT 140, one or more configuration registers 145, and a state machine 150. The controller 110 can also include a stability controller 155 to ensure that the controller 110 does not cause the power supply 115 to oscillate. In certain situations, the controller 110 can be prevented from exercising any control over the power supply 115. This can be referred to as a "bypass" mode. The controller 110 can activate or deactivate the bypass mode as needed. For example, in order to configure the LUT 140, the controller 110 can activate the bypass mode. When voltage regulation of the power supply 115 is desired, the controller 110 can deactivate the bypass mode.

In some implementations, the LUT 140 can be stored as a part of the controller 110. In other cases, the LUT 140 can be stored in a storage device external but accessible to the controller 110. The LUT 140 can be configured to store the frequency-voltage characteristics. Therefore, when the processor needs to run an application at a given frequency, the LUT 140 is accessed to determine a corresponding voltage level to be provided as the supply voltage 117. In some implementations, the LUT 140 is accessed directly by the controller 110 hardware for faster access. However, software access to the LUT 140 is also possible. The state machine 150 can read from the LUT 140 by sending for example a LUT read request 185 on a dedicated hardware connection. The LUT read request 185 can include, for example, identification of a frequency or frequency range for which the LUT 140 is being accessed. In response, corresponding LUT entries are made available by the LUT 140 on ports of the LUT 140. In some implementations, the LUT 140 can also signal the controller 110 that a corresponding LUT entry has been found. In a software mode, a LUT index pointer 187 can be returned to the state machine 150. In the software mode, software can load an address in a register to trigger the LUT search operation. If a corresponding LUT entry is found, the LUT index pointer 187 is returned to the controller 110. The software then reads the entries from memory based on the LUT index pointer 187. The state machine 150 can access the LUT entry corresponding to the desired frequency or frequency range based on the LUT index pointer 187. In some implementations, one or more LUT entries may be returned in response to the LUT read request 185. In some implementations, the LUT 140 can include a separate entry for different frequencies.

Each entry can include, for example, a performance target such as a target delay of a CPE, programming codes for one or more monitors 125, and a voltage value corresponding to the particular frequency. Typically the contents of the LUT 140 are fixed for a particular type of IC chip. The LUT 140 can be programmed by software or hardcoded into the system 100

The controller 110 includes a state machine 150 that can serve as the bus master that controls access to the bus 135. The state machine 150 typically controls information flow to and from the various parts of the controller 110. In some implementations, the controller 110 polls one or more of the monitors 125 to obtain data about current operating conditions of the processor 105 and communicates with the controller 110 to determine if the supply voltage 117 needs to be adjusted. The state machine 150 can then communicate with the power supply 115 to adjust the supply voltage 117 as needed.

The system 100 can also include one or more configuration registers 145 that can be used to configure the state machine 150 or other parts of the controller 110. For example, the controller 110 can be enabled using a configuration register 145. Similarly, the state machine 150 can be instructed to access the LUT 140 to obtain stored values related to a particular frequency using the configuration register 145. Examples of some configuration registers 145 are provided below in Table 1.

TABLE 1

Examples of configuration registers

| Register Name | Address | Description |
| --- | --- | --- |
| AVS_DISABLE_HPM_RANGE_CHK | 0x4 | This register disables/enables out of range checks |
| AVS_STATUS | 0x8 | This register defines all status bits which contribute to interrupts |
| AVS_STATUS_MASK | 0xC | This register defines mask bits for the status bits which contribute to interrupts |
| AVS_LUT_BINARY_SEARCH_MODE | 0x10 | This register enables either the 'binary search mode' or the 'linear search mode' for the LUT access. |
| AVS_LUT_INDEX | 0x14 | This register stores the {frequency, process, temperature} and the corresponding address is read and written to the address LUT_INDEX_READ_DATA_PTR |
| AVS_DBG_FIFO_WR_LOCK | 0x18 | This register blocks any writes to the Debug FIFO to prevent overwriting the data. |
| AVS_RESET_DBG_FIFO | 0x1C | This register resets the Write/Read pointers of the Debug FIFO such that the FIFO starts from an empty state |
| AVS_DVFS_MODE | 0x20 | This register triggers the stability controller to calculate the voltage for the power supply from the HPM delay values |
| AVS_LUT_INDEX_DATA_PTR | 0x24 | When register LUT_INDEX_ADDR is loaded with {frequency, process, temperature}, the corresponding entry from the LUT is written to this address LUT_INDEX_RD_DATA_PTR For example, when the AVS is controlled through software and the LUT search algorithm is implemented in hardware, the software writes the ADDR in a register and triggers the hardware. The start point of the LUT entry is written to the register 'LUT_INDEX_RD_DATA_PTR' for the software to read out. |

TABLE 1-continued

Examples of configuration registers

| Register Name | Address | Description |
|---|---|---|
| AVS_PROCESS_TYPE | 0x2C | This register indicates the process type of the chip |
| AVS_DISABLE_TEMP_RANGE_CHK | 0x30 | This register disables/enables the out of range checks, .i.e. hardware checks to see if the temperature sensor read value is within the allowed range. If the value is outside the range, the hardware, (if disabled by this register), goes into a bypass mode and lets software take control.<br>If enabled, even when the value is outside the range, the hardware, i.e., the AVS controller continues with the AVS algorithm. |
| AVS_HPM_SAMPLE_WAIT | 0x34 | This register defines the wait time before sampling the HPM(s) |
| AVS_CTRL_BYPASS | 0x38 | This register enables/disables the bypass mode.<br>0 - AVS Controller/Sequencer in the hardware is not bypassed<br>1 - AVS Controller/Sequencer in the hardware is bypassed and the software can implement the AVS algorithm |
| IRQ_MODE | 0x3C | This register enables/disables the IRQ Mode |

The controller 110 can include a stability controller 155. The system 100 operates in a feedback loop, and the stability controller 155 ensures that the feedback loop does not enter an unstable oscillations mode. Typically the stability controller 155 is used to provide stability to the feedback loop and to prevent undesirable behavior such as thermal runaway. The stability controller 155 can compensate for changes in various environment variables. In some implementations, the stability controller 155 receives monitor samples 192 and a trigger signal 190 from the state machine 150. The stability controller 155 analyzes the monitor samples 192 and sends back a voltage signal 194 to the state machine 150. For example, the stability controller 155 may change the voltage level of the signal 194 only if certain threshold conditions are met. Such threshold based control can prevent the controller 110 to unnecessarily adjust the supply voltage 117 if variations in monitor samples 192 are due to environmental or noise related reasons.

The system 100 can also include a phase locked loop (PLL) interface 160 that manages frequency requests from the processor 105. For example, if the processor 105 has to execute a new application at a particular frequency, the processor 105 can communicate information on that particular frequency to the controller 110 through the PLL interface 160, for example, using a dedicated frequency request line 165. The controller 110 can then be configured to access the LUT 140 to determine whether the power supply 115 would be able to supply a suitable voltage required to execute the application at that particular frequency. If an appropriate supply voltage 117 is available from the power supply 115, the controller 110 can be configured to confirm to the processor 105 that the particular frequency can be supported. Such confirmation can be provided, for example, using a frequency-confirm line 170 via the PLL interface 160.

The system 100 is useful for any device that needs to conserve power. For example, the system 100 can be included in a mobile device such as a mobile phone, a tablet computer, a laptop computer, a portable audio player, a portable video player, or a digital camera.

Figure 2:
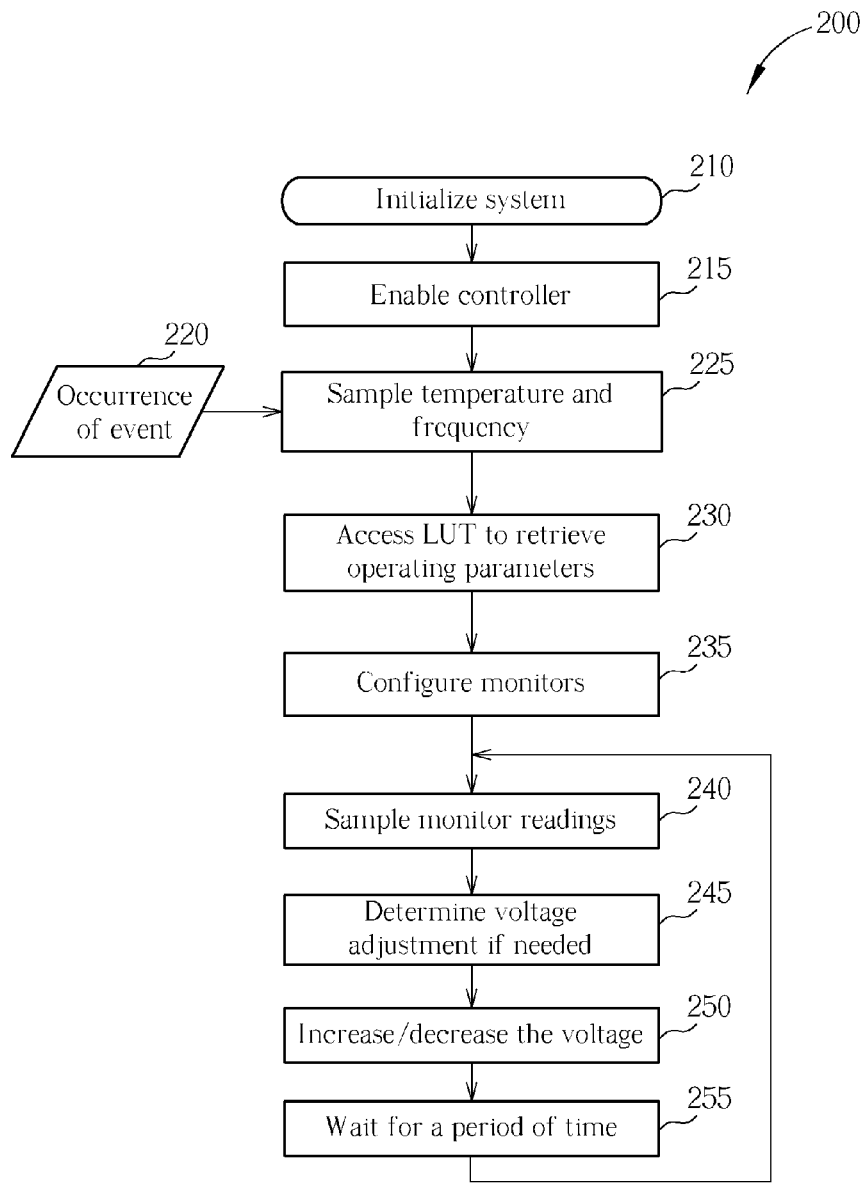
FIG. 2 is an example of a process for controlling an operating voltage of a system.

FIG. 2 is a flowchart of an example process 200 that includes a sequence of operations to control an operating voltage of a system. The operations of the process 200 can be performed in various parts of the system 100 described above with reference to FIG. 1. Operations can include initializing a voltage regulation system (210). This can be done, for example, by way of a hardware reset. In some implementations, when the system is initialized, the controller may be disabled and maximum possible voltage is supplied from the power supply. Operations also include enabling the controller (215) to regulate the supply voltage from the power supply. In some implementations, the controller can be enabled using software. However hardware lines or connections can also be used for enabling the controller. Once the controller is enabled, the state of the voltage regulation system can be referred to as an initial state. Typically, the voltage regulation system waits for the occurrence of an event (220) in the initial state.

The occurrence of an event (220) causes the voltage regulation system to start functioning from the initial state. An event can include, for example, a change in an operating temperature in one or more portions of the integrated circuit, or a frequency change due to a new load. The occurrence of such events can initiate the voltage regulation system to output a different supply voltage than what it was operating under before the occurrence of the event. For example, if a more complex application is launched, a higher frequency requirement for the application may trigger a need for a higher voltage. Alternatively if a lower frequency application is launched, the supply voltage could be reduced. In some implementations, when switching to a higher performance level (i.e. a higher frequency), the worst case voltage for the target frequency is achieved before changing the frequency of the circuit under operation. This can be done to ensure that the circuit under operation can seamlessly support the higher performance level. In such cases, the operating frequency is not changed (for example, by holding the frequency of a phase locked loop (PLL)) until the requisite voltage for the higher frequency is available. When switching to lower frequencies, the frequency change can be made immediately because lower frequencies typically do not require a higher operating voltage.

Operations can include sampling the operating temperature and frequency (225) when the occurrence of an event is detected. This can include, for example, reading outputs of the temperature sensor and one or more monitors. The temperature sensor and the monitors can be substantially similar to the temperature sensor 130 and monitors 125 described above with respect to FIG. 1. In some implementations, any attempts by software to configure a new frequency in the PLL register are held off until a voltage change is achieved. However, the new frequency value (along with temperature information from the temperature sensor 130) can be used for accessing the LUT 140. In some implementations, the process type can be identified by reading a counter value of a ring oscillator disposed on the integrated circuit.

Operations also include accessing one or more LUTs to retrieve operating parameters (230) corresponding to the sample temperature and frequency. In some implementations, the LUT access is done via dedicated hardware connections to reduce the access time, thereby reducing the response time for the overall feedback loop. In some implementations, when a LUT read request is initiated at the controller, the LUT is searched by the index {frequency, temperature, process} until a match is found. If a match is not found, the controller can be configured to go into a bypass mode and let software take over control. Various search algorithms can be used to search the LUT for a matching entry. For example, the LUT can be searched either in a binary or a linear search mode as follows:

Linear Search

Worst case latency is O(n), where 'n' is the number of entries in the LUT

The LUT need not be sorted.

Pseudo code for the search can be represented as, for example:

```
for(entry=first; entry<end; i++){
    If (key==entry) return entry;
    else entry=entry+1;
}
```

Binary Search

Worst case latency is O(log n), where 'n' is the number of entries in the LUT.

The LUT entries are sorted. The sorting can be done during run-time or the LUT can be stored as a sorted list.

Pseudo code for the search can be represented as, for example:

```
while (first<end) {
    int mid=(first+end)/2; //Compute mid point.
    if (key<sorted[mid]) {
        end=mid; //repeat search in bottom half.
    } else if (key>sorted [mid]) {
        first=mid+1; //Repeat search in top half.
    } else {
        return mid; //Found it. return position
    }
}
```

Accessing the LUT can result in retrieving an LUT entry that corresponds to the sampled temperature and frequency. The operating parameters in the LUT entry can include, for example, one or more of the following:

a target voltage $V_1$. This can be for example the worst-case or a minimum voltage required for executing an application at the target frequency.

A configuration of monitors $M_1, \ldots M_n$. The configurations can correspond to what is needed to accurately emulate critical paths under the target operating conditions.

Corresponding target monitored delays $D_1, \ldots, D_n$.

Weights attached to each monitor $W_1, \ldots, W_n$, when a weighted combination of outputs from a plurality of monitors is used.

Upper and lower thresholds associated with the target delays. These thresholds can indicate, for example, boundaries that cannot be crossed for safe operating conditions.

Initial operating conditions for the system can be configured based on the LUT entry. For example, the power supply can be configured by the controller to provide the supply voltage $V_1$. This can be the initial voltage for the power supply to start from such that the circuit can safely operate at the new target frequency.

Operations include configuring the monitors in accordance with the retrieved LUT entry (235). For example, the monitors can be configured such that for the given operating conditions, the delays (or a weighted combination of delays) of the monitors represent a delay associated with a critical path under the operating conditions. Configuring the monitors can include choosing which of the available monitors are to be used. For example, if it is known that a particular monitor is not proximate to a critical path under the given operating conditions, that particular monitor can be ignored via the configuration (such as by setting the corresponding weight value to be very low or even zero). Configuring the monitors can also include deciding which logic gates and multiplexers (MUX) are to be chosen for a particular monitor to accurately model the critical paths using the monitor.

Operations can also include sampling monitor readings (240) after the monitors have been configured. In some implementations, at least some of the monitors can also be sampled prior to the configuration. When the monitors are configured to emulate or model a critical path of the circuit, sampling the monitor readings includes determining an estimated delay of the critical path using the monitor readings. Readings from one or more monitors can be used in determining the estimated delay. For example, the delay from three separate monitors can be read and an average (or a weighted average) of the three delay is taken to be the estimated delay of the critical path that is being modeled.

Operations also include determining whether voltage adjustment is needed (245) based on the estimated delay. For example, if the estimated delay is determined to be lower than the target delay, the indication could be that the supply voltage can be reduced from the current level. Similarly, if the estimated delay is determined to be higher than the target delay, the indication could be that the supply voltage needs to be increased. If the estimated delay is outside the region defined by the upper and lower thresholds associated with the target delay, the indication could be that an error condition (such as one due to unfavorable external operating conditions or programming error) has occurred and corrective action needs to be taken immediately. In such cases, the controller can put the voltage regulation system into a bypass mode. In some implementations under the bypass mode, software takes over the control and takes corrective action before disabling the bypass mode. In some implementations, the system can also be shut down based on the severity of the error condition.

Operations also include increasing or decreasing the supply voltage (250). To increase or decrease the supply voltage, the controller analyzes the data from the monitors and calculates the voltage increment/decrement that could be made and communicates the desired voltage change to the power supply. In some implementations, the controller communicates with a stability controller in order to ensure that the feedback loop in the voltage regulation system does not go into unfavorable conditions such as runaway oscillations. In some implementations, the error values from the stability controller can be stored in an appropriate storage location such as a debug FIFO. The debug FIFO can be a designated memory location for storing information from the monitors and/or the stability controller. For example, the debug FIFO can include an array of 16 or 32 bit registers or memory locations that are configured to store information including, for example, delay values through the monitors, weights assigned to the monitors, current value of the supply voltage, error messages and values, and inputs and outputs related to the stability controller. In some implementations, the debug FIFO can be configured to be written into by hardware and read from by software.

Operations also include waiting for a period of time (255) before initializing any operations related to the next voltage change. The period of time allows the voltage regulation system to settle to a steady-state before the next readings are sampled. In some implementations, the period of time can depend on the amount of voltage adjustment determined by the controller. For example, for a given system, the time required for a unit voltage change can be predetermined (e.g. 1 µs for a 0.01V voltage change) and the period of time to wait can be computed based on how many units of voltage adjustment is being done. In the current example, the period of time to wait after a 0.05V voltage adjustment would be 5 µs. The period of time can also be calculated based on the number of cycles of a reference clock. By determining the period of time to wait based on the amount of voltage adjustment, waiting for a predetermined worst-case duration can be avoided thereby decreasing the response time in the feedback loop.

After waiting for the period of time, the monitor readings are sampled again (240). The voltage regulation system can continue to adjust the voltage by such substantially continuous monitoring of on-chip conditions. The monitoring can be continued until a load change is triggered by the occurrence of another event (220). Therefore, the methods and systems described herein allow for substantially continuous adjustment of the supply voltage between LUT accesses and facilitate significant power saving via fine-grained voltage adjustments. When a load change occurs, the look-up table can be accessed again as described above to retrieve new operating parameters possibly including new configurations for the monitors.

Figure 3:
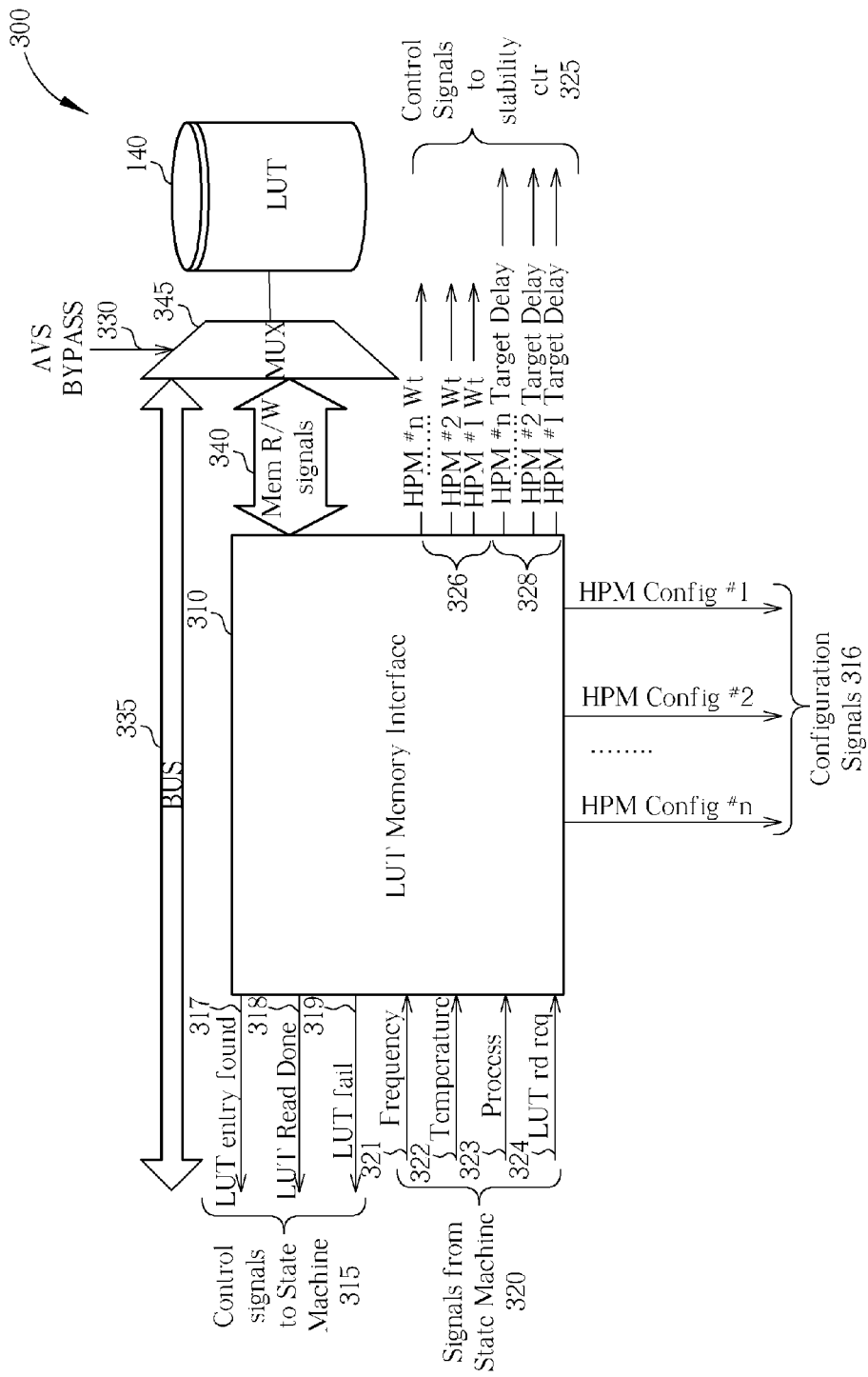
FIG. 3 is a schematic diagram illustrating an example of a look-up-table memory interface.

FIG. 3 is a schematic diagram illustrating a system 300 including an example of a look-up table (LUT) memory interface 310. In some implementations, the LUT memory interface 310 can manage communications between the LUT (e.g. the LUT 140 as described with reference to FIG. 1) and other portions of the controller 110 such as the state machine 150, or the stability controller 155. For example, the LUT memory interface 310 can be configured to send control signals 315 to the state machine 150 or receive signals 320 from the state machine 150. The LUT memory interface 310 can also send configuration signal 316 to the different monitors 125 (referred to FIG. 3 as hardware performance monitors (HPM)). The LUT memory interface 310 can also be configured to send control signals 325 to the stability controller 155.

The control signals 320 that are received from the state machine 150 can include for example, a LUT read request 324. In some implementations, the LUT read request signal 324 can be substantially similar to the signal 185 described above with reference to FIG. 1. The signals 320 from the state machine 150 can also include signals that represent various operating parameters of the circuit such as the signals 321, 322, and 323 that represent frequency, temperature, and process, respectively. The number of bits for the different signals can be different. In the example shown in FIG. 3, frequencies are each represented using ten bits whereas temperature and process are represented using two bits. The control signals 315 to the state machine 150 can include LUT related signals such as LUT Entry Found 317, LUT Read Done 318, and LUT Fail 319. The control signals 325 to the stability controller 155 can include, for example, signals 326 and 328 representing the weights and target delays, respectively, associated with the different monitors 125.

The system 300 can also include a multiplexer 345 that can control whether the LUT memory interface 310 or a bus interface 335 can access the LUT 140. The multiplexer 345 can be controlled using, for example, a bypass signal 330. In some implementations, when the bypass signal 330 is set (i.e. when the voltage regulation system is in the bypass mode), the data can be written into the LUT 140 using the bus interface 335. Alternatively, when the system is not in the bypass mode, the multiplexer 345 can allow the LUT memory interface 310 to read to and write from the LUT 140 using memory read/write signals 340.

Data can be stored in the LUT 140 in various formats. In some implementations, the LUT 140 can be an array of 32-bit registers that store operating parameters for different indexes corresponding to various combinations of frequencies, processes, and temperatures. An example of the LUT memory structure is shown below in Table 1. The memory structure shown in table 1 is for illustrative purposes and should not be considered limiting. Other memory structures, for example ones with more or less operating parameters, are within the scope of this application.

TABLE 1

Example of LUT memory structure

| 0 | Freq[9:0], -Proc[1:0], -Temp[1:0] | |
| 2 | Voltage[7:0], -Wt3[2:0], -Wt2[2:0], -Wt[2:0] | |
| 4 | Config-HPM-#1-[31:0] | |
| 6 | Target-Delay[31:0]-----HPM-#1 | |
| 8 | Upper-Threshold[31:0]-----HPM-#1 | |
| A | Lower-Threshold[31:0]-----HPM-#1 | |
| C | Config-HPM-#2-[31:0] | |
| E | Target-Delay[31:0]-----HPM-#2 | |
| 10 | Upper-Threshold[31:0]-----HPM-#2 | |
| 12 | Lower-Threshold[31:0]-----HPM-#2 | |
| 14 | Config-HPM-#3-[31:0] | |
| 16 | Target-Delay[31:0]-----HPM-#3 | |
| 18 | Upper-Threshold[31:0]-----HPM-#3 | |
| 1a | Lower-Threshold[31:0]-----HPM-#3 | |
| 1c | Freq[9:0], -Proc[1:0], -Temp[1:0] | |
| 1e | Voltage[7:0], -Wt3[2:0], -Wt2[2:0], -Wt[2:0] | |
| 20 | ... | |

Configurable Critical Path Emulator

In some implementations, when at least one of the monitors 125 is used to measure or track a delay of a critical path, the monitor 125 can include electronic circuitry referred to as a critical path monitor (CPM), or critical path emulator (CPE). In general, a CPE is a hardware performance monitor (HPM) circuit that can be used in an adaptive voltage scaling system (for example, the system 100 described above with reference to FIG. 1) to emulate or track the critical path(s) in the circuit being monitored. The CPE can be of various types including, for example, sampling based, averaging type, or mirror type HPMs. A CPE can be configured to identify whether the delay through the critical path is too high or too low and this information can be used to control an operating voltage of the circuit. The CPE can be placed in substantially the same voltage domain as the circuit that the CPE is monitoring. For example, the CPE can be connected to the same supply voltage 117 as the processor 105 and can be configured to track the changes in delays accordingly to an actual critical path in the system.

Figure 4:
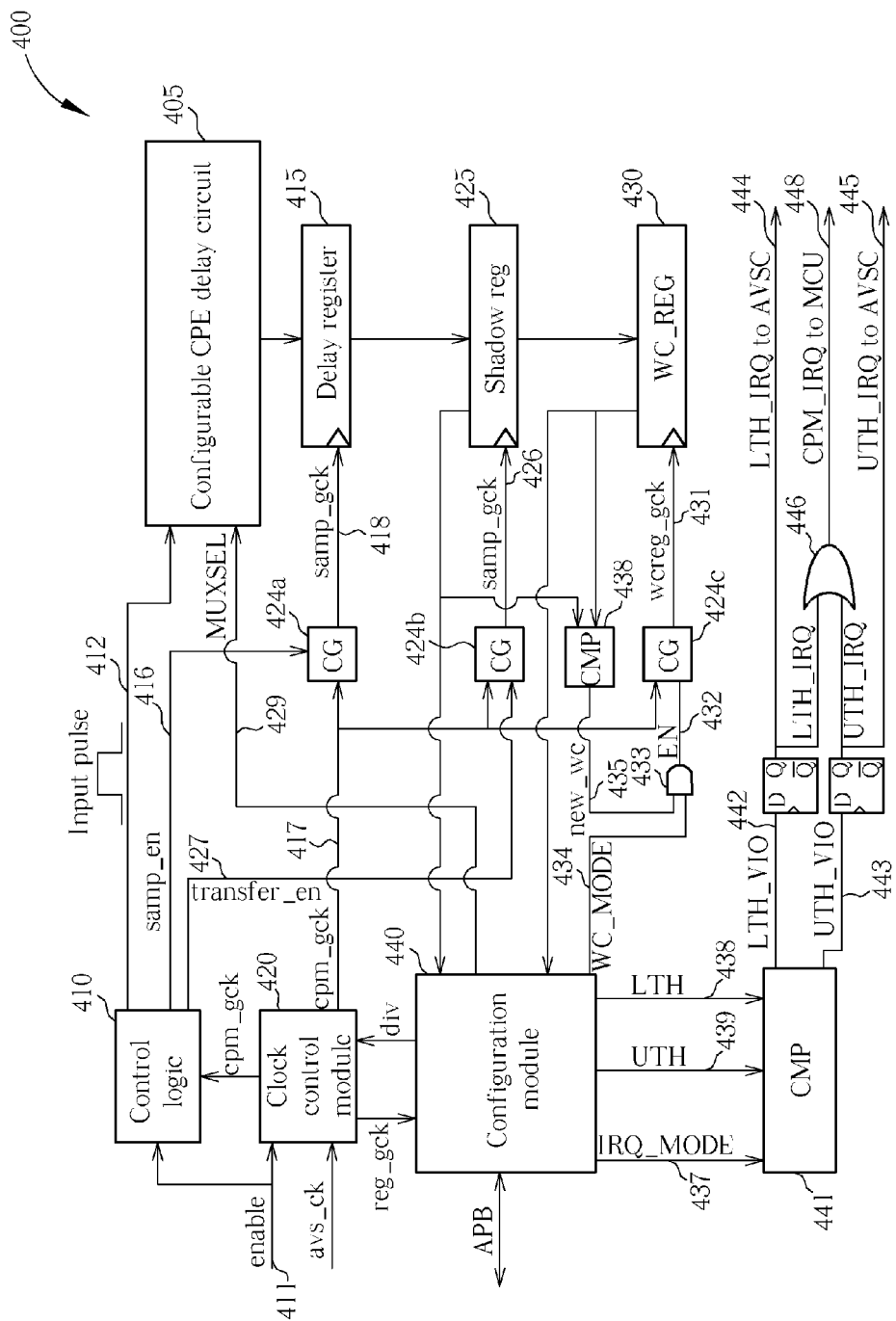
FIG. 4 is a schematic circuit diagram of an example critical path emulator.

FIG. 4 shows a schematic circuit diagram of an example CPE 400. The CPE 400 can be substantially similar to one or more of the monitors 125 described above with reference to FIG. 1. Controlling the operating voltage based on the feedback from the CPE 400 allows the circuit to operate at a lower voltage than prescribed by requirements under a given set of operating conditions. In some implementations, the lower voltage can include some guard band to prevent failure of the circuit. The CPE 400 can allow the critical path to be monitored predictably, thereby allowing the operating voltage to be set accordingly.

The CPE 400 includes a configurable delay circuit 405. The configurable delay circuit 405 is a configurable mix of logic gates and/or interconnected delay chains that can be configured to emulate or resemble the actual critical path of the circuit under the given operating conditions. Once the configurable delay circuit 405 is configured to emulate the critical path, the propagation delay through the delay circuit 405 can be reliably used as a measure of the delay through the actual critical path. A critical path of a given circuit under a given set of operating conditions can be defined as a combination of the total number of logic blocks (for example, logic gates) traversed by a signal between two predetermined time points, for example, two consecutive clock edges. For a given critical path, if the operating voltage is reduced from that in the given set of operating conditions, the timing requirements may be violated and this may cause the circuit to fail. Typically, the operating voltage for a given critical path is kept a threshold safety amount over the corresponding failing voltage. In some implementations, the actual critical path under a given set of operating conditions (voltage, frequency etc.) is known beforehand, for example, during a characterization of the circuit. Alternatively, a particular characteristic of the critical path under the given set of operating conditions may be known. For example, the characteristic can be a delay through the critical path (also referred to as a target delay) under the given set or sets of operating conditions. In such cases, the configurable CPE delay circuit 405 can be configured such that a time taken (referred to herein as the measured delay) by an electrical signal to traverse the configurable CPE delay circuit 405 substantially matches the target delay. The operating voltage to the circuit can be adjusted based on comparing the measured delay with the target delay. For example, if the measured delay is found to be larger than the target delay, the operating voltage is usually increased. Alternatively, if the measured delay is found to be less than the target delay, the operating voltage can be reduced. The configurable CPE delay circuit 405 is configured such that the measured delays under various operating conditions track the corresponding target delays under substantially similar conditions. The configurable CPE delay circuit is further described below with reference to FIG. 5.

The CPE 400 also includes a control logic block 410 that can be configured to control the delay circuit 405. The control logic 410 provides the input electrical signal (for example the input pulse 412) to the delay circuit 405. The propagation delay of the input pulse 412 through the delay circuit 405 is measured as an indicator of the propagation delay through the actual critical path. The control logic 410 can include a register (for example, a CPE_CTRL_MMR register) having one or more bits that can be set to enable the CPE 400. The one or more bits can be set by the MCU 120 (described above with reference to FIG. 1), for example, by the enable signal 411, to enable the CPE 400. The control logic 410 also controls at what time points the delay circuit 405 is sampled to obtain the measured delay. In some implementations, the control logic 410 also controls when the measured delay is read by software or hardware from the registers that store the measured delay.

The CPE 400 includes a delay register 415 that stores the most recent value of the measured delay. The delay register 415 can also be controlled by the control logic 410. For example, the control logic 410 can provide an enabling signal (samp_en 416), which enables a clock gate 424a to provide a control signal (samp_gck 418) to the delay register 415 based on a clock signal (cpm_gck 417). For example, the enabling signal 416 and the clock signal 417 can be provided to the clock gate 424a. When the enabling signal 416 is at logic high, a high clock signal 417 can be passed on by the clock gate 424 as the control signal 418. In some implementations, the clock gate 424 is an AND gate or other circuitry that implements the logic AND. In some implementations, when the control signal 418 is at logic high, the states of certain logic blocks from the delay circuit 405 are transferred to the delay register 415. The content of the delay register 415 is indicative of the measured delay. The delay register 415 does not necessarily store the actual value of the measured delay. For example, the content of the delay register 415 may indicate the difference between the measured delay and an expected delay (or a target delay). The content of the delay register 415 may represent whether a signal propagated more or less than a targeted number of gates within a set period of time (e.g., between two rising clock edges).

The clock signal 417 can originate from a clock control module 420. In some implementations, the clock control module 420 receives an input clock signal (e.g., ays_ck 421) and provides the input clock signal as a second clock signal (e.g., cpm_gck 423) to other parts of the CPE 400 when the enable signal 411 is at a logic high. In some implementations, the clock signal provided to the clock control module 420 is substantially the same clock signal that is provided to the processor 105. In some implementations, the clock signal provided to the clock control module 420 can be gated off when the CPE 400 is disabled to reduce power consumption.

The CPE 400 can also include a shadow register 425. The measured delay as stored in the delay register 415 is transferred to the shadow register 425 before being provided to other software or hardware modules. In some implementations, the measured delay can be read only from the shadow register 425 and not from the delay register 415. This can avoid any potential instability resulting from an attempted read (for example, by software) from the delay register 415 when data is being transferred from the delay circuit 405 into the delay register 415. Transfer of data from the delay register 415 into the shadow register 425 can also be controlled by the control logic 410. For example, the transfer can be enabled by a control signal 426 that is provided by the clock signal 417 when a transfer enable signal (e.g., transfer_en 427) from the control logic 410 is at logic high. This can be facilitated, for example, by using a clock gate 424 that receives the clock signal 417 and the transfer enable signal 427. The clock gate 424 can be configured to provide the control signal 426 to the shadow register 425.

The CPE 400 can also include a min-max register WC_REG 430. The min-max register 430 can be configured to store, for example, the highest or lowest measured delay over a given period of time. For example, in order to measure the maximum delay of a circuit executing a given set of applications over a given period of time, the limiting-case mode for the CPU 400 can be enabled for the entire duration of the given period. At any given time point during that period, the min-max register 430 stores the highest (or lowest, if needed) measured delay up to that given time point. In some implementations, a measured delay is transferred from the shadow register 425 to the min-max register 430 if a control signal (e.g. wcreg_gck 431) is at logic high. In some implementations, the clock signal 417 can be provided as the control signal 431 by a clock gate 424c if the limiting-case enable signal 432 is at logic high. A logic circuit (for example an AND gate 433) provides the limiting-case enable signal 432 if a limiting-case mode signal 434 is enabled and a control signal (e.g. new_wc 435) indicates the presence of a new limiting-case value in the shadow register 425. The limiting-case mode signal 434 can be enabled for the CPE 400 to execute in the limiting-case mode. The control signal 435 can be provided, for example, by a comparator 438 that compares the content of the shadow register 425 with the most recent content of the min-max register 430. For example, if the min-max register 430 is configured to store the highest delay, the comparator 438 compares the content of the shadow register 425 and the min-max register 430 and provides the control signal 435 if the measured delay is higher than that indicated by the content of the min-max register 430. Alternatively, if the min-max register 430 is configured to store the smallest delay, the comparator 438 provides the control signal 435 if the measured delay is the lower than that indicated by the content of the min-max register 430. The min-max register 430 can be read by other software or hardware modules.

For example the min-max register 430 can provide stored content to the configuration module 440.

The configuration module 440 can include one or more registers (for example, memory mapped registers (MMR)) that are used to configure the delay circuit 405 and/or other portions of the CPE 400. The one or more registers in the configuration module 440 can include, for example, configuration registers and/or status registers. For example, one or more registers in the configuration module 440 may store values that indicate how the delay circuit is to be configured to emulate a given critical path. In some implementations, such values can be provided to the delay circuit 405 via a control signal such as MUXSEL 429. In some implementations, the configuration module 440 can include an APB slave interface which can be used to access the registers in the configuration module 440. In some implementations, the APB slave interface is a 32-bit interface. In some implementations, the APB slave interface is an interface designed for peripheral slaves such as MMR registers, etc. The interface can be based on an ARM protocol. In some implementations, the configuration module 440 is clocked by the clock signal reg_gck which is a gated version of the clock signal ays_ck that clocks the processor 105. The clock signal reg_gck can also be a divided version of the clock signal ays_ck and can be provided from the clock control module 420 based on a division factor indicated by the configuration module via a 'div' signal line.

In some implementations, the configuration module 440 can be used to enable the CPE 400 to operate in an interrupt driven mode. The interrupt driven mode is referred to herein as the IRQ mode. In the IRQ mode, the CPE 400 can be programmed with a lower threshold and an upper threshold. The upper and lower thresholds indicate maximum and minimum delays, respectively, that can be tolerated for the circuit to operate properly. When operating under the IRQ mode, if the measured delay falls outside the region defined by the upper and lower thresholds, the CPE 400 can be configured to send an interrupt to the controller 110 and/or the MCU 120. In some implementations, the controller 110 can increase or decrease the operating voltage by a predetermined amount based on whether the lower or upper threshold has been crossed, respectively. Other actions may also be taken by the controller 110 or the MCU 120 based on the interrupt. On the other hand, if the measured delay is within the upper and lower thresholds, no interrupt is sent and the operating voltage is not adjusted.

In some cases, operating under the IRQ mode is useful because it involves low intervention or and/or bus usage. Because the voltage is adjusted only when an interrupt is issued, the intervention is usually low in the IRQ mode as compared to the mode where the adjustments are based on continuous monitoring. In some implementations, direct connections between the controller 110 and the monitors 125 reduce usage of the bus 135, thereby freeing up the bus bandwidth for other usage. The configuration module 440 can include a specific register (for example, an IRQ_MODE register bit) that can be used to set or reset the IRQ mode. In some implementations, the configuration module 440 can enable the IRQ mode using the control signal IRQ_MODE 437.

The CPE 400 can also include a logic block 441 (a comparator in this example) that determines whether an interrupt is to be sent. For example, the logic block 441 can be configured to determine whether the lower threshold or the upper threshold has been violated based on control signals from the configuration module 440. The control signal from the configuration module 440 can include, for example a control signal LTH 438 and another control signal UTH 439 that indicate the programmed values of the lower and upper thresholds. Accordingly, the logic block 441 can provide the control signals LTH_VIO 442 or UTH_VIO 443 when the lower and upper thresholds are violated, respectively. These control signals can be processed through additional logic or sent directly to the controller 110 and/or the MCU 120. For example, the control signals 442 and 443 can be passed through one or more flops before they are sent as interrupt requests LTH_IRQ 444 and UTH_IRQ 445, respectively, to the controller 110. In some implementations, the interrupt requests 444 and 445 may pass through an OR gate 446 before being sent to the MCU 120 as the interrupt request CPM_IRQ 448. Because only one of the interrupt requests 444 and 445 may be triggered at a time, using the OR gate 446 can reduce the number of interrupt lines to the MCU 120.

Figure 5:
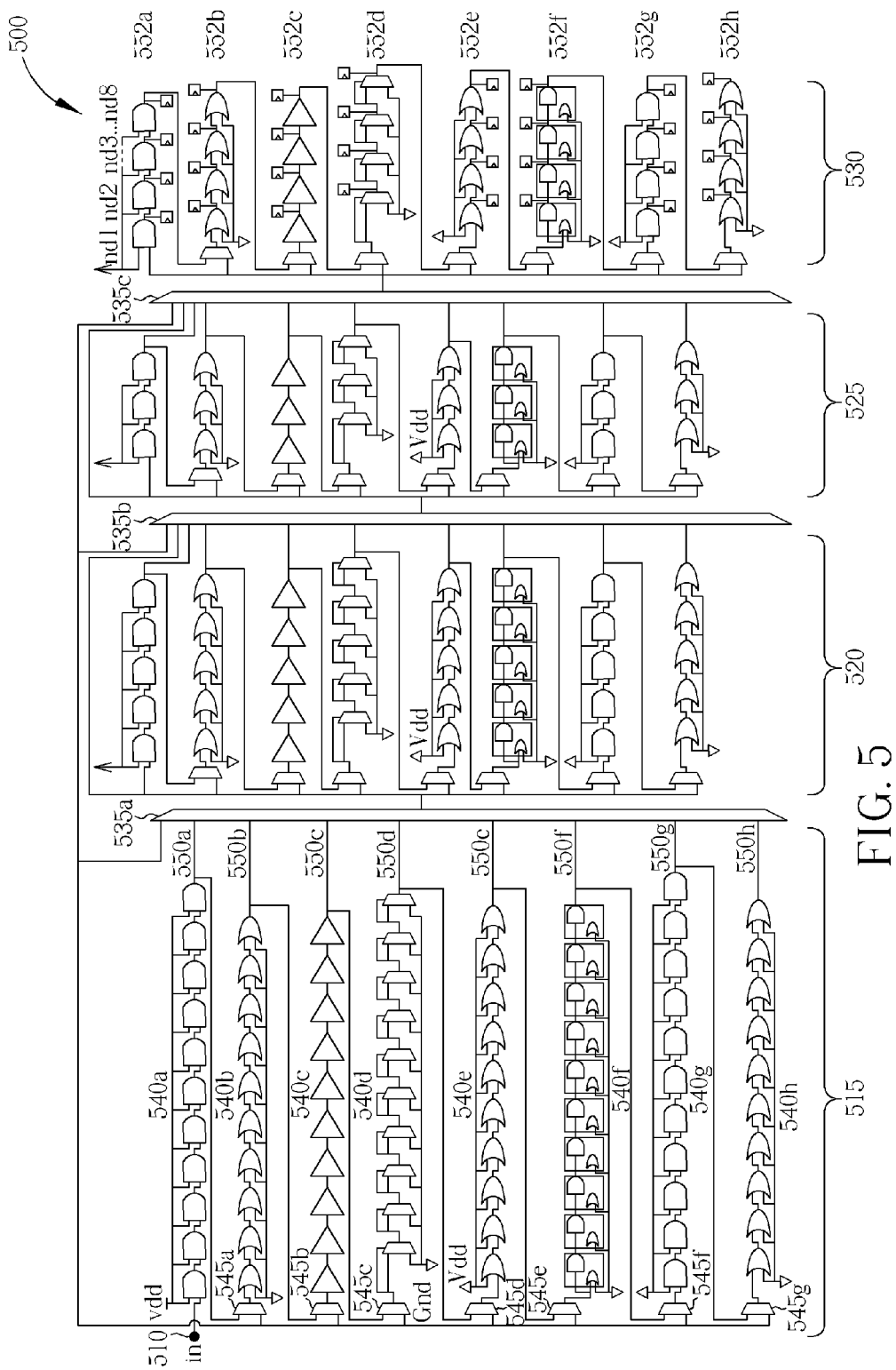
FIG. 5 is an example of internal circuitry of a configurable delay circuit.

FIG. 5 shows an example of internal circuitry 500 of the configurable delay circuit 405. In some implementations, the internal circuitry 500 includes a configurable mix of logic blocks and interconnects, various combinations of which can be chosen to emulate actual critical paths in the circuit. For example, the internal circuitry 500 can include one or more stages 515, 520, and 525, each of which includes one or more substages of different logic gates. Each of the stages is connected in series to the next through a multiplexer. For example, the first stage 515 is connected to the second stage 520 through a multiplexer 535a, and the second stage 520 is connected to the third stage 525 through a multiplexer 535b. The internal circuitry 500 also includes a sample stage 530 that facilitates sampling of an output signal that is propagated through the internal circuitry 500.

Each of the stages 515, 520, and 525 includes one or more logic substages 540a, 540b, . . . , 540h (540 in general) that can be selected individually or in series with one another. Each of the logic substages 540 can include, for example, a series of logic units. In the example shown in FIG. 5, the logic substage 540a includes ten AND gates connected in series. Each of the other logic substages 540 can include other types of logic units connected in series with one another. The logic units that are used in the logic substages 540 can include, for example, OR gates, NOT gates, NAND gates, NOR gates, multiplexors, complex gates (e.g. AND-OR gates), or other types of logic units. In some implementations, a logic substage 540 can include only a predetermined length of interconnect. The interconnect delays can be modeled, for example, using delay line macros. The delay line macro can be a conductive wire of configurable length that is used to model the interconnect delay. This allows the delay due to the macro to be fixed and predictable. The delay lines can be connected in series and can be selected or bypassed as needed to model a given interconnect delay. In some implementations, a stage 515 can include two or more of substantially similar logic substages 540. The number of logic units in the substages 540 can be substantially same or different from one another. The output of each of the substages 540 are connected to the multiplexer 535 for propagation to the next stage. The output of each of the substages is also connected as an input to the next sub-stage (if available) through one of the multiplexers 545a, 545b, . . . , 545g (545, in general).

The sub stages 540 are connected to the next corresponding sub stage through the multiplexer 545. For example, the sub stage 540a is connected to the sub stage 540b through the multiplexer 545a and so on. A second input to each of the multiplexers 545 is an input signal 510. For the later stages (for example the stage 520 or the stage 525), the input signal is the signal from the previous stage coming from a multiplexer 535. The multiplexer 545 is used to select an input for the corresponding sub stage 540. For example, the multiplexer 545 can select either the input signal or the signal coming from the previous sub stage, in which the selected signal is propagated through the corresponding sub stage.

By selecting appropriate inputs using the multiplexers 545 and 535, an input signal can be made to propagate through a selected combination of logic units in a given stage. For example, if it is desired to propagate the input signal 510 through ten NOR gates and ten inverter gates (or NOT gates) only, the multiplexer 545*a* is configured to select the input signal 510 and the multiplexer 545*b* is configured to select the sub stage 540*b*. The multiplexer 535*a* is configured to select the output 550*c* (i.e. the output of the sub stage 540*c*) for propagation to the next stage 520, and the input signal 510 traverses only the desired number of gates in the first stage 515. In another example, if the input signal 510 is to traverse through ten AND-OR gates only, the multiplexer 545*e* is configured such that it selects the input signal 510 as an input to the sub stage 540*f*, and the multiplexer 535*a* is configured such that it selects the signal line 550*f* (i.e. the output of the sub stage 540*f*) as an input to the next stage 520. In some implementations, the input signal to a certain stage can be made to bypass all logic units of that stage. This can be done, for example, by configuring the multiplexer 535 to select the signal line corresponding to the input signal to that stage. For example, if it is desired that the input signal 510 is directly passed on to the next stage 520, the multiplexer 535*a* can be configured to select the topmost signal line that is directly connected to the input signal 510. As shown in FIG. 5, the input signal 510 can be directly passed on to a sampling stage 530 by selecting the topmost signal lines in each of the multiplexers 535*a*, 535*b*, and 535*c*.

The number of logic units through which the input signal 510 is propagated in the second stage 520 and/or the third stage 525, can be selected substantially similarly as described above with respect to the first stage 515. The number of logic units in each of the output stages 540 as well as the number of logic units in a given stage (e.g. stage 515) can be chosen based on the critical paths that are to be emulated. FIG. 5 shows ten, five and three logic units in each of the sub stages of the first stage 515, second stage 520, and third stage 525, respectively. This configuration is shown for illustrative purposes and should not be considered limiting. In other implementations, one or more of: the number of stages, the number of sub stages in each stage, the number of logic units in each sub stage, or the nature of logic units can be different from the configuration shown in the example of FIG. 5. For example, the sub stages in the different stages can have substantially the same number of logic units, or a given sub stage can have different types of logic units.

The combination of stages, sub stages, or logic units that are selected for a given set of operating conditions depend on the nature of a corresponding critical path. In general, the combination is selected such that a propagation delay of the input signal 510 through the selected combination of logic units tracks the target delay (i.e. the propagation delay through the corresponding critical path) sufficiently closely. In some implementations, the combination is selected such that the propagation delay through the selected combination of logic units tracks the target delay for different operating conditions (i.e. different voltage-frequency combinations). In some implementations, various combinations can be examined (for example, using appropriate software or actual testing during characterization phase) to determine a combination that tracks the target delays for various operating conditions. The determined combination can be stored, for example, in the LUT 140 during a calibration process.

The sampling stage 530 is a portion of the configurable delay circuit from which the output of the configurable delay circuit is sampled. The sampling stage can also be referred to as a sampling circuit. The sampling stage 530 includes a plurality of sub stages 552*a*, 552*b*, . . . , 552*h* (552, in general), each of which includes one or more logic units (for example, logic gates) with sampling flip-flops (also referred to as flops) connected at the outputs of each logic unit. In some implementations, each of the sub stages of the sampling stage 530 can include a different type of logic unit. For example, the sub stage 552*a* can include a series of NAND gates whereas another sub stage 552*c* includes a series of inverter gates (or NOT gates). The number of logic units in a given sub stage 552 can depend on the desired resolution of the measured delay and/or the target delay. For example, if the target delay and/or the measured delay is represented using eight bits, each of the sub stages 552 can be configured to have eight logic units. Therefore, the logic units are also referred to as delay elements. In some implementations, the sampling circuit can be placed in substantially the same voltage domain as the processor 105.

Figure 6A:
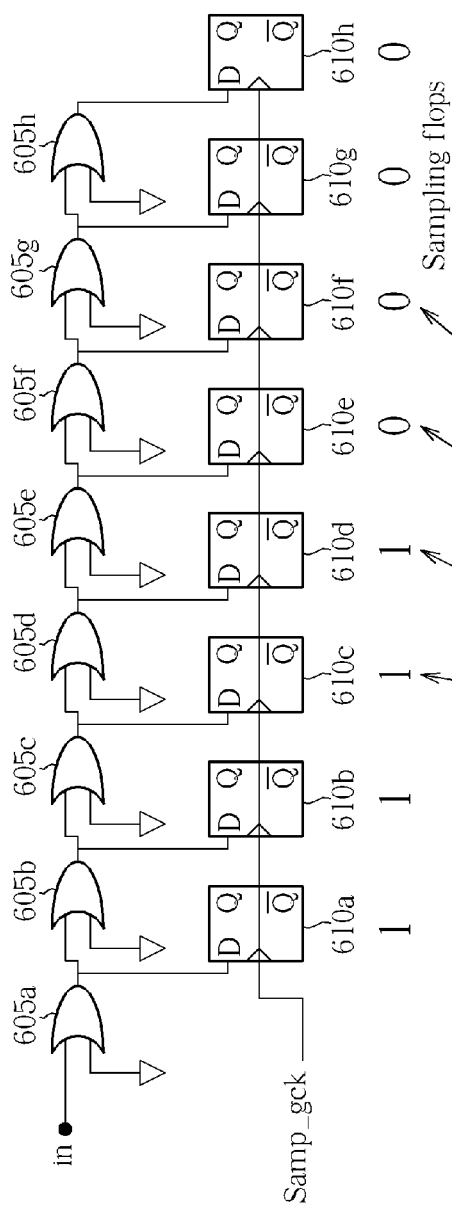
FIG. 6A is an example of circuitry in a portion of a sampling stage of a configurable delay circuit.

FIG. 6A shows an example of circuitry 600 of a sub stage 552 of a sampling stage 530. The circuitry 600 includes eight OR gates 605*a*, 605*b*, . . . , 605*h* (605, in general). Outputs of the OR gates 605 are connected to corresponding sampling flops 610*a*, 610*b*, . . . , and 610*h*, respectively. The outputs of the gates 605 can be sampled at the non-inverting outputs of the corresponding sampling flops. Typically, the sampling flops 610 are cleared when the CPE 400 is reset. Outputs of the logic units as well as the input signal 510 can also be set to logic low upon reset. To measure the propagation delay of an input signal through the CPE 400, an electrical signal (for example, a pulse) is launched at a rising edge of a clock signal and the state of the outputs of the OR gates 605 are captured in the sampling flops 610 at the next rising clock edge. This is shown using the plots of FIG. 6B.

Figure 6B:
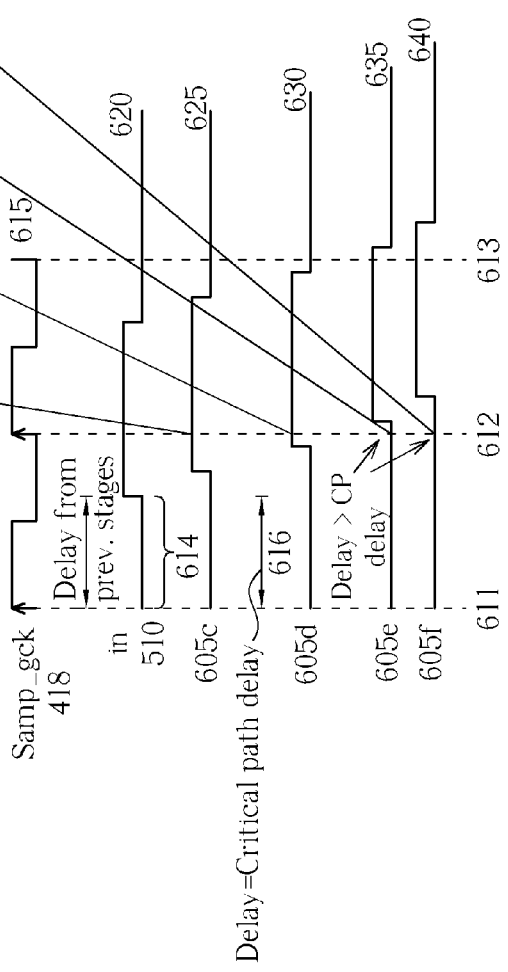
FIG. 6B shows plots of output signals at various portions of a sampling stage.

Referring now to FIG. 6B, the plot 615 depicts the sampling clock (e.g., the clock signal 418 described with reference to FIG. 4) and the plot 620 depicts the input signal 510 as received at the input of the sampling stage 530. The input signal, which is generated at a rising clock edge at the time point 611, arrives at the input of the sampling stage 530 after a delay 614. The plots 625, 630, 635 and 640 depict the outputs of the gates 605*c*, 605*d*, 605*e* and 605*f*, respectively. Outputs of the other gates are not shown in FIG. 6B. These outputs are sampled at the next rising clock edge of the clock 418 at the time point 612. The sampled values are obtained as the states of the sampling flops 610 and represent the measured delay. In this example, the measured delay is represented using eight bits. If the measured delay is within one gate delay of the expected critical path delay (i.e., the target delay) 616, the output of the flops 610 are represented using the series of bits 11110000. In this example, the input signal advances through the first four gates 605*a*-605*d* in the time period between the two clock edges at time points 611 and 612. If the propagation delay through the CPE 400 is higher than the target delay, the input signal propagates through a smaller number of gates 605 and the sampled values can read, for example, 1110000 or 11000000. This indicates that the measured delay is more than the target delay and the input voltage to the system can be increased to cause the propagation delay to match the target delay. Conversely, if the propagation delay through the CPE 400 is less than the target delay, the input signal propagates through a higher number of gates 605 and the sampled values can read, for example, 11111000 or 11111100. This indicates that the measured delay is less than the expected delay and the input voltage to the system can be decreased to cause the propagation delay to match the target delay. If the sampled values read 11110000 as shown in FIG. 6B, this indicates that the propagation delay is substantially similar to the target delay and it is not necessary to adjust the voltage. If the sampled values read 00000000 or 11111111, this indicates that the propagation delay is higher or lower, respectively, than the target delay. In some implementations, this can prompt a large adjustment in the supply voltage and/or reconfiguration of the configurable delay circuit 405, or an interrupt. The target delays 616 are pre-determined, for example, during a characterization phase of the circuit.

Because the propagation delay is measured in terms of a number of gates traversed in the sampling stage 530, the resolution or accuracy at which the propagation delay can be measured depends on a delay of an individual logic unit in the sampling stage 530. In some implementations, faster logic units can be used in the sampling stage 530 to measure propagation delays with increased accuracy. In some implementations, the number of logic units in the sampling stage 530 can be increased to cover a larger range of measured delays.

In some implementations, the target delays 616 can be stored, for example, in the LUT 140. In such cases, the measured delay can be compared with the target delay as retrieved from the LUT 140 and the voltage adjusted accordingly. For example, if the measured delay is determined to be different from the target delay by a small amount (for example, as represented by a difference in only one bit), the corresponding voltage adjustment can also be small accordingly. If the measured delay is different from the target delay by a larger amount, the voltage adjustment can also be configured to be correspondingly larger.

Figure 7:
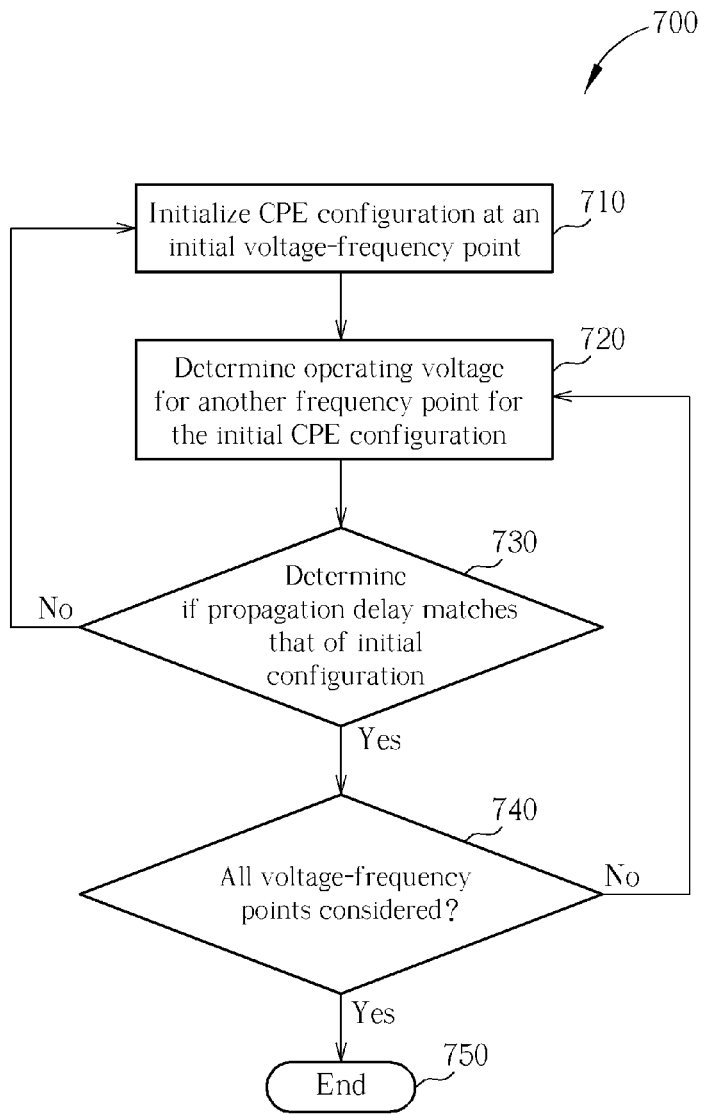
FIG. 7 is a flowchart of an example process for initializing and calibrating a critical path emulator.

FIG. 7 is a flowchart of an example process 700 that includes a sequence of operations for initializing and calibrating a CPE 400. These operations can be performed, for example, by a calibration module. The calibration module can be implemented using various parts of an adaptive voltage scaling system including for example a processor (e.g., the processor 105) and/or a controller (e.g., the controller 110). The operations include initializing the CPE configuration at an initial voltage-frequency value or point (710). The initial voltage-frequency point can be chosen from characterization data available for the circuit that is being monitored using the CPE. In some implementations, the voltage-frequency point can be determined by determining a failure voltage at a given frequency. A safety margin can then be added to the failure voltage to obtain the initial voltage-frequency point. Initializing the CPE configuration also includes determining a configuration of the configurable delay circuit 405 such that the measured delay for the configuration shows the desired value. For an eight bit sampling stage as described above with reference to FIG. 6A, the desired value can be 11110000.

Operations also include determining an operating voltage at a different frequency for the CPE configuration selected during the initialization (720). This can be done, for example, by determining a failure voltage at the different frequency and adding a safety margin to the failure voltage. Operations also include determining if the measured delay corresponding to the operating voltage at the different frequency matches the desired value (e.g. 11110000) (730). If the value does not match, the initialization (710) is repeated again. Alternatively, if the measured delay matches the desired value, a check is performed to see if all voltage frequency points for which calibration is needed have been considered (740). If not, then the step 720 is repeated again for another frequency. When all voltage-frequency points have been determined, the initialization and calibration process ends (750).

The CPE 400 can be configured to operate under various modes. For example, the CPE 400 can operate in a continuous sample mode. In this mode, the CPE 400 continuously samples readings from the sampling stage 530. In this mode, the data register 425 is read by the controller 110 or software as needed. The CPE 400 typically does not maintain any history information in this mode. In some implementations, the controller 110 can be configured to disable the CPE 400 at certain times, for example, when the power supply 115 is changing the supply voltage 170.

In some implementations the CPE 400 can be configured to operate in a mode where the CPE 400 only stores a maximum or minimum value of the measured delay in the min-max register 430. This mode can be referred to as a sticky mode and can be useful in certain situations, for example, in determining the worst IR drop for an application when the application is executed for a substantially long period of time. In this mode, the CPE 400 compares a recently available value of the measured delay to the current value stored in the min-max register and stores the recent value in the min-max register only if the value is greater (or in some cases, less) than the current value. In some implementations, the CPE 400 can be configured to operate in an interrupt driven mode (IRQ mode) as described above with reference to FIG. 4. In the IRQ mode, the CPE 400 typically does not sample further readings until the IRQ mode is reset.

Stability Controller

The voltage scaling system described herein uses a closed loop feedback system to adjust the supply voltage from a power supply based on readings from one or more hardware monitors. In a typical closed loop system, the output of the system is obtained (for example, using a hardware monitor) and a difference of the output from a reference value is calculated. The difference can also be referred to as an error. A controller can then adjust an input to the system based on the error value. The adjustment to the input can be made whenever the measured output value is substantially different from the reference value, i.e. whenever the error value is above a threshold. However, in designing a closed loop control system, it is generally desirable to ensure that the system is stable. An unstable feedback system can potentially overcompensate for deviations from the reference value. In some cases, this can lead to undesirable conditions such as sustained or runaway oscillations around the reference value.

In some implementations, a stability controller is provided in order for the adaptive voltage scaling system to exhibit stable responses to various changes in environment variables and/or operating conditions. The stability controller can also prevent the adaptive voltage scaling system from entering undesirable conditions such as oscillations or thermal runaway. The changes to the environment variables can include, for example, IR drops, temperature changes, ageing or a combination of these factors. The changes to the operating conditions can include, for example, a change in operating frequency. In some implementations, the changes in the environmental variables and/or operating conditions change the output of the system, which is captured by the one or more hardware monitors. A controller can process the feedback from the one or more hardware monitors and adjust the supply voltage provided by a power supply such that the output is closer to a desired reference value.

Figure 8:
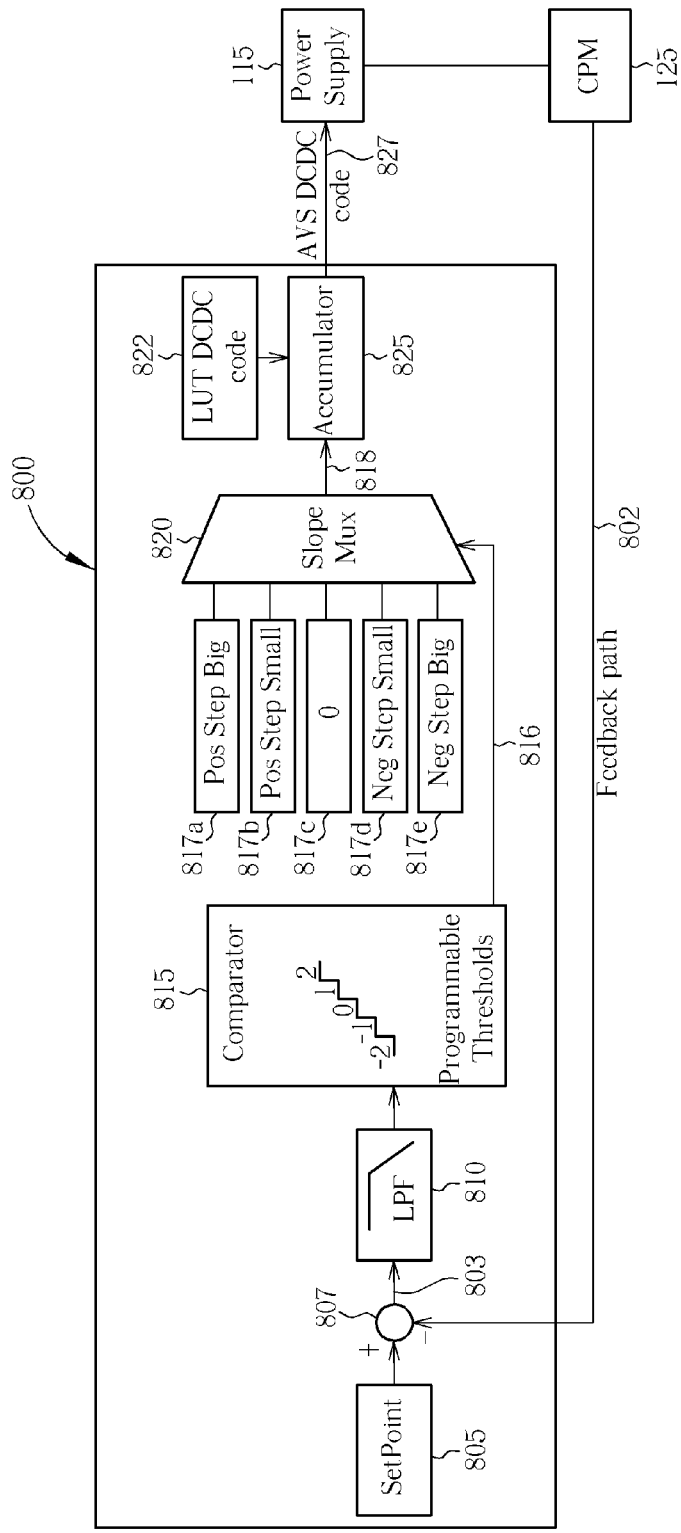
FIG. 8 is a schematic block diagram of an example of a stability controller.

FIG. 8 shows a schematic block diagram of an example of a stability controller 800. In some implementations, the stability controller 800 can be used as the stability controller 155 described above with reference to FIG. 1. The stability controller 800 receives a feedback signal (for example, through feedback path 802) from one or more hardware monitors 125 (represented herein as a critical path monitor (CPM)), calculates an error signal 803 (for example, as a difference between the feedback and a set point 805) and adjusts a power supply 115 based on the error signal 803. The feedback signal is based on a parameter value (such as a delay) measured by the hardware monitor. The error signal can be calculated, for example, using an adder circuit 807. The set point 805 is the reference value for the stability controller 800. In some implementations, the set point 805 is a target delay that is desired for a given set of operating conditions. In such cases, the CPM 125 provides a measured delay as feedback and the error signal 803 is calculated as a difference between the set point 805 and the measured delay. The set point 805 can be provided, for example, from the LUT 140 in accordance with the operating conditions. The operating conditions can include, for example, a clock frequency, temperature or a process skew. For example, if the frequency of operation of the circuit changes, a new set point 805 can be provided to the stability controller 800 from the LUT 140. The set point 805 and the measured delay are typically digital values. In some implementations, all available bits (eight bits, for example) can be used for measuring a small range of delay near the set point 805. This can effectively increase a resolution at which the delay is measured.

The stability controller 800 can include a low pass filter (LPF) 810 that filters the error signal 803 to suppress high frequency components such as noise. The cutoff frequency of the LPF 810 is chosen in accordance with a loop bandwidth of the closed loop adaptive voltage scaling system. For example, the cutoff frequency can be twice the loop bandwidth or less. Both analog and digital filters can be used as the LPF 810. In some implementations, the LPF 810 is a finite impulse response (FIR) or an infinite impulse response (IIR) digital filter. Both floating point and fixed point implementations can be used to realize the LPF 810 as a digital filter.

The stability controller 800 also includes circuitry to quantize the filtered error signal. In the example of FIG. 8, a comparator 815 is used for that purpose. The comparator 815 can be configured to quantize the error signal to one of a predetermined number of discrete levels. Therefore, the comparator 815 essentially reduces a granularity of the error signal to the predetermined number of discrete levels. This causes the closed loop feedback system to react and adjust the supply voltage only when a change in the error signal exceeds a predetermined threshold. As a result, the adaptive voltage scaling system is prevented from making adjustments in response to small changes and going into potentially undesirable oscillations. The comparator can use a set of thresholds in quantizing the error signal. For example, if the filtered error signal e is such that $-e_1<=e<e_1$, the quantized error signal is assigned a value "0". Similarly, if $e_1<=e<e_2$, the quantized error signal can be assigned a value "1" and so on. In some implementations, when the output of the monitor 125 is high resolution (for example, 16 or 32 bit), the comparator 815 can reduce complexity of the circuit by binning a first number of error values to a second, lower number of discrete levels. In some implementations, the comparator 815 also allows for a non-linear response to error signals by setting the thresholds in a non-linear fashion. For example, the thresholds can be set such that the error signals corresponding to monitor readings closer to the set point 805 are binned into different discrete levels with a higher resolution than error signals corresponding to monitor readings at a significant distance from the set point 805.

In some implementations, the comparator 815 can be configured to be programmed with the thresholds for increased flexibility. For example, the thresholds can be programmed in accordance with a desired sensitivity to the error signal. Closely spaced thresholds typically result in a higher sensitivity than thresholds that are more spaced apart. On the other hand, closely spaced thresholds offer less immunity to noise than thresholds that are more spaced apart. In some implementations, both negative and positive errors can be accounted for separately using different thresholds and corresponding discrete levels. Alternatively, the discrete levels can be based only on absolute value of the error signal. In some implementations, the quantization can be uniform such that the discrete levels are substantially equally spaced and/or substantially equal in range. In other cases, non-uniform quantization and/or unequally spaced discrete levels can also be used. The thresholds corresponding to the different discrete levels can be chosen based on various factors, such as properties of the silicon used in the system 100, the error signal 803 and/or the variations thereof.

The comparator 815 can be configured to provide an output signal 816 based on the discrete level chosen for a particular error signal. In some implementations, the output signal 816 can be represented using one or more bits. In the example shown in FIG. 8, the five discrete levels −2, −1, 0, 1 and 2 can be represented as 110, 101, 000, 001 and 010, respectively. In such cases, the most significant bit (MSB) can be used to represent whether the level corresponds to a negative or positive value. In the current example, a "1" as the MSB represents a negative value whereas a "0" as the MSB represents a positive value. The second and third bits following the MSB can represent a binary value for the corresponding discrete level. Other combinations of bits or digits representing the discrete levels can also be used for the output signal 816. The number of bits or digits in the output signal 816 can be chosen based on the number of discrete levels in the comparator 815. For example, if the number of discrete levels is greater than eight, the output signal 816 includes at least four bits. In some implementations, the output signal 816 can also be an analog signal.

The output signal 816 can be used as an input selector for a multiplexer 820 (also referred to as a slope MUX). The multiplexer 820 is configured such that one of several inputs is chosen and provided as an output 818 of the multiplexer 820 based on the signal 816. In some implementations, the inputs of the multiplexer 820 can be provided from multiple registers 817a-817e (817 in general). The number of registers (and the number of inputs to the multiplexer 820) can be chosen, for example, in accordance with the number of discrete levels in the comparator 815. Continuing with the present example, if the output signal 816 of the comparator 815 is "010", the register 817a can be chosen by the multiplexer 820 and the contents of the register 817a can be provided as the output signal 818. Similarly, if the output signal 816 of the comparator 815 is "110", the register 817e can be chosen by the multiplexer 820 and the contents of the register 817e can be provided as the output signal 818, and so on.

The content of each of the registers 817 can represent an amount of adjustment that is needed for the supply voltage. In the present example, the register 817a is chosen when the error signal 803 is a large positive value. This indicates that the feedback signal (e.g. the measured delay) is significantly less than the set point 805 (e.g., the target delay) and that the supply voltage needs to be increased by a substantially large amount. Accordingly, the content of the register 817a can be configured to represent a large positive step. In the present example, the register 817c is chosen when the error signal 803 is sufficiently close to zero, i.e. the feedback signal is sufficiently close to the set point 805. In such cases, no adjustments may be necessary and the content of the register 817c can be configured to represent that. In the example of FIG. 8, contents of the registers 817a-817e represent a large positive step, a small positive step, no change, a small negative step and a large negative step, respectively. The contents of the registers 817 can include a combination of bits or digits.

In some implementations, the registers 817 can be configured to be programmable. For example, the registers 817 can be programmed by a controller in accordance with the desired step changes. The step changes can also be referred to as slope factors or slope values. The programmability of the registers 817 can allow for increased flexibility in designing the stability controller 800. For example, because a magnitude of a step change can be related to the response time of the adaptive voltage scaling system (i.e. the power supply 115 would need more time to implement a larger step change), the registers 817 can be programmed in accordance with desired response times. This can be done independent of programming the threshold values of the comparator 815.

The stability controller 800 can also include an accumulator 825 that is configured to provide an adjustment code 827 (referred to in FIG. 8 as the AVS DCDC code) to the power supply 115 based on an initial code 822 (referred to in FIG. 8 as the LUT DCDC code) from the LUT 140 and the multiplexer output 818. In some implementations, the initial code 822 provides a starting value that represents an initial supply voltage and the multiplexer output 818 is used to fine tune the starting value to an adjusted value that represents a substantially optimal voltage for the given operating conditions. For example, the initial code 822 can be represented using a combination of bits or digits and some least significant bits (LSBs) of the combination can be adjusted based on the multiplexer output 818 to provide the adjustment code 827. The adjustment code 827 is decoded, for example by a voltage regulator, to determine how a supply voltage from the power supply 115 is to be adjusted.

Figure 9A:
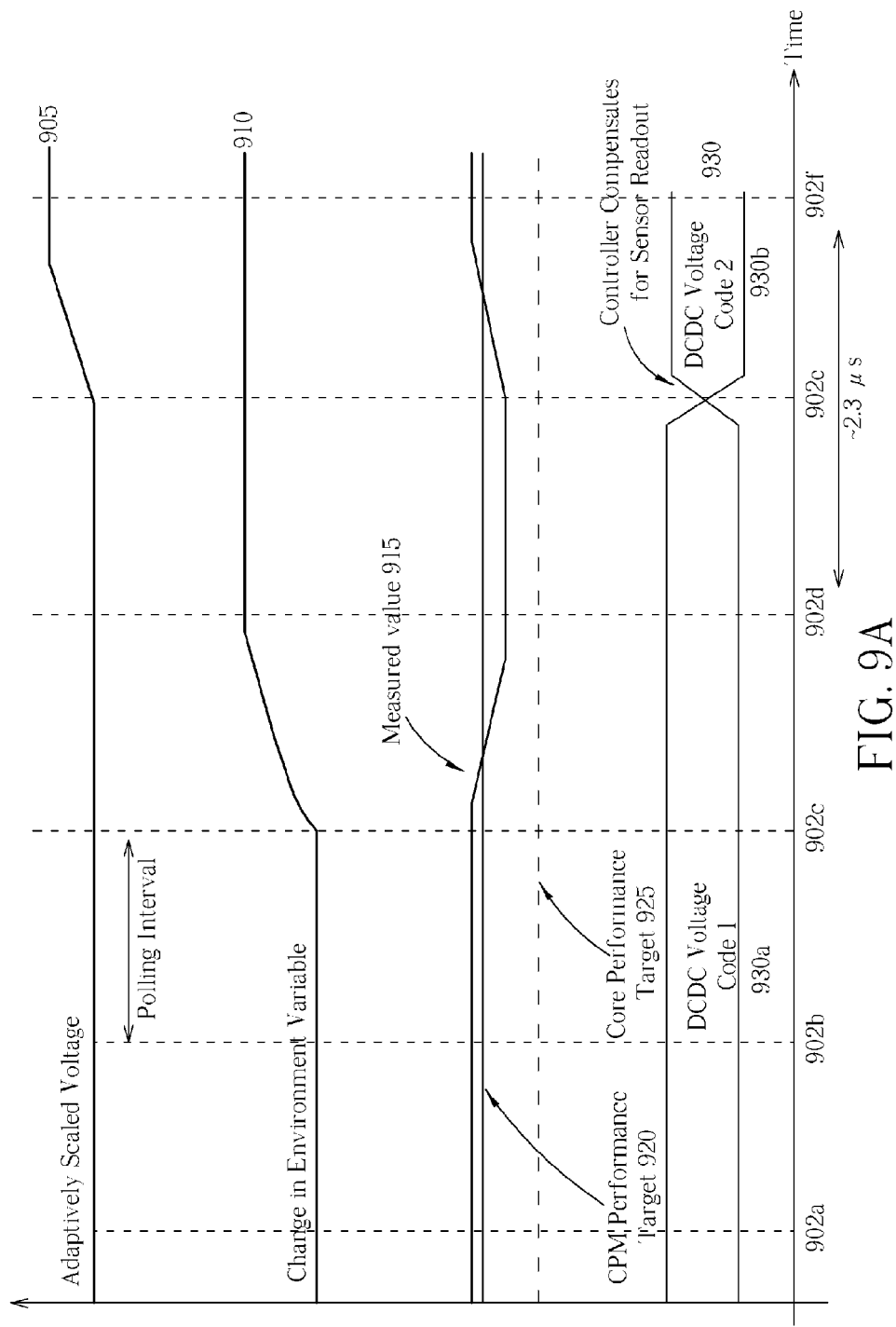
FIG. 9A show plots that illustrate by an example how the stability controller reacts to a change in an environment variable.

FIG. 9A shows plots that illustrate by an example how the stability controller 800 reacts to a change in an environment variable. The common x-axis of the plots denotes time. The time points 902a-902f (902, in general) denote the time points at which the CPM 125 is sampled. The plot 905 denotes the adaptively scaled voltage and the plot 910 denotes an environment related variable. The plots 915 and 920 denote the measured value (or feedback signal) and the set point (referred to as the CPM target performance), respectively. The plot 925 denotes the processor core performance target, i.e. a value above which the processor performance is not affected. The set point (as represented by the plot 920) is usually above the processor core performance target (represented by the plot 925) such that even when the measured value (represented by the plot 915) dips slightly below the set point, the measured value is still above the core performance target and the functions of the processor core are not interrupted. The plot 930 denotes various adjustment codes (referred to as DCDC voltage codes) 827.

In the example shown in FIG. 9A, between sampling points 902a and 902c, the environment variable is substantially unchanged and the measured values plot 915 is sufficiently close to the set point plot 920. Note that even though the measured values plot 915 does not coincide with the set point plot 920, the difference is taken as substantially equal to zero due to the error quantization, and no adjustments are triggered. The system operates under the code 930a under these conditions. The environment variable changes at a time point near the sampling point 902c, which causes the measured value to change soon thereafter. As a result, the measured values plot 915 dips below the set point plot 920. The measured value is sampled at the sampling point 902d. If the deviation of the measured value from the set point does not exceed a threshold, no adjustments are made. If the deviation exceeds the threshold, a new adjustment code 930b is obtained (for example, near the sampling point 902e). The delay between the sampling point 902d and the time point 902e at which the adjustment code is changed can be attributed to various factors such as processing delays in the controller 110 and signaling times between the controller 110 and the power supply 115. The new adjustment code causes the power supply to adjust the supply voltage and the measured value once again ramps up to a level close to the set point. If the measured value is determined to be sufficiently close to the set point at the next sampling point 902f, another code adjustment is performed, otherwise the system continues to operate under the code 930b.

Figure 9B:
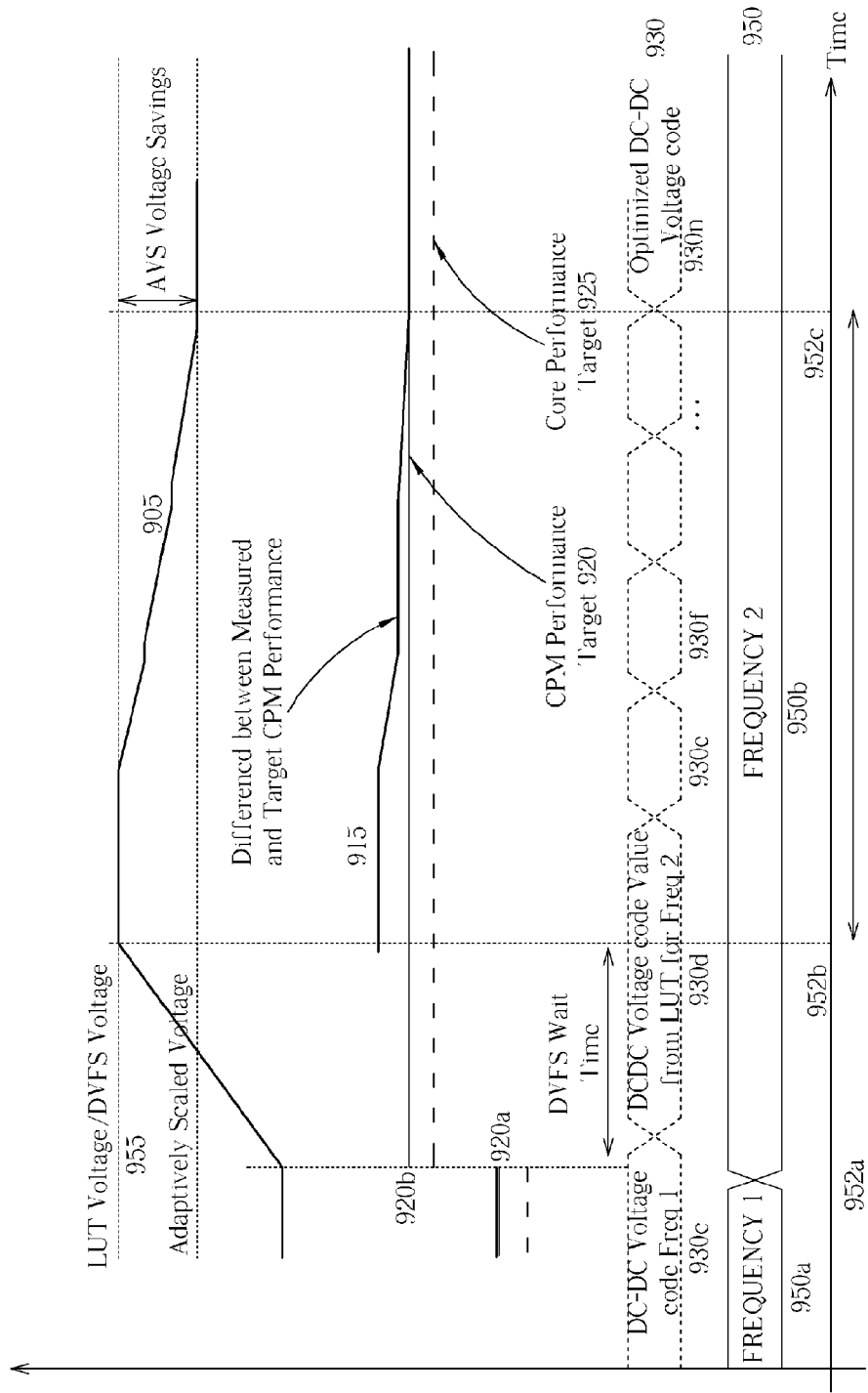
FIG. 9B shows plots that illustrate by an example how the stability controller reacts to a change in an operating frequency.

FIG. 9B shows plots that illustrate by an example how the stability controller 800 reacts to a change in an operating frequency. In this example, the operating frequency changes from a first frequency 950a to a second frequency 950b at time point 952a. The LUT 140 is accessed and the set point is changed from a value 920a to a value 920b accordingly. The core performance target also changes from the level 925a to the level 925b. The adjustment code is also changed from 930c to 930d as specified in the LUT. Accordingly, the adaptively scaled voltage is ramped up (or down, in some cases) to a voltage value 955 (referred to in FIG. 9B as the LUT voltage/DVFS voltage) as illustrated by the plot 905. After the power supply is allowed to reach the LUT voltage 955, sampling of the measured value is resumed at the time point 952b. In some implementations, the sampling of the measured value is suspended for a duration of time until the power supply output stabilizes. The duration of time can depend on an amount of change in the power supply voltage. In such cases, the larger the change in the power supply voltage, the longer is the duration of time (also referred to as a wait time). In some implementations, the wait time can also be predetermined. For example, a wait time to accommodate the largest possible voltage change can be selected. In some cases the wait time can depend on a feedback signal from the power supply. The feedback signal can be generated by the power supply responsive to reaching the new voltage level 955 specified by the new adjustment code 930d.

The adjustment codes 930 are fine-tuned based on the feedback of the measured values until the measured value is sufficiently close to the set point (near time point 952c in this example). The adjustment codes are changed several times during the adjustment process (to 930e, 930f, etc.) before converging to the adjustment code 930n. The adaptively scaled voltage is adjusted through these changes to the adjustment codes and is eventually reduced to the level 960. The difference between the voltage levels 955 and 960 therefore represents the voltage savings achieved using the adaptive voltage scaling system.

Voltage Scaling Using Weighted Combination of Monitor Feedback

As described with reference to FIG. 1, the adaptive voltage scaling system 100 can include one or more hardware performance monitors 125a, 125b, . . . , 125n (125 in general). In such cases, the error signals corresponding to the multiple monitors 125 can be used in a weighted combination in determining how the adaptive voltage scaling system 100 is to be adjusted. For example, different weight values can be applied to the feedback or error signals from hardware monitors under different conditions, and the power supply output voltage level can be controlled according to weighted measurements or values derived from the weighted measurements. The conditions can include, for example, clock frequencies, supply voltage drops, temperature, silicon age, or process skew.

When the conditions change, the controller can be configured to obtain corresponding weights (e.g., from a look-up table).

In some implementations, the different monitors 125 are disposed in various parts of a processor or integrated circuit, e.g., a system-on-chip (SOC), to measure parameters related to the performance of the SOC for variations in voltage, silicon age and temperature. For example, one of the hardware monitors can measure a parameter associated with a cache memory in a data processor, and another one of the hardware monitors can measure a parameter associated with a circuit path outside of the cache memory in the data processor. Under certain conditions, the cache memory may be accessed extensively, and the critical path may be located inside the cache memory. In other conditions where the cache memory is accessed less frequently, the critical path may reside outside of the cache memory. Having multiple monitors 125 disposed in various parts of the processor or the SOC allows for added flexibility in accurately measuring a performance of the processor or SOC.

Variations in silicon age can be manifested in various ways, including, for example, as negative bias temperature instability (NBTI) and hot carrier injection (HCI) effects. HCI in turn can be a function of activity, temperature, gate voltage and drain to source voltage. In some implementations, by reducing the supply power and/or scaling the supply power in relation to workload, effects such as voltage stress and susceptibility can be reduced to address HCI related issues. NBTI can result in an increase in threshold voltage which, in some implementations, results in a slowing down of the critical timing path. By changing the supply voltage in accordance to measured changes in delay, an automatic voltage scaling system can be configured to handle such slowing down caused by NBTI.

In some implementations, a location of a critical path in a processor can vary from one application to another, or from one operating condition to another. The delay through the critical path can depend on the on-chip conditions (e.g. temperature) at or near the critical path. Therefore, if the delay through the critical path is used as an indicator of processor performance, a monitor 125a which is disposed nearer the location of the critical path may provide a more reliable estimate of the processor performance than another monitor 125b which is located farther away from the location. In such a case, the error signal corresponding to the monitor 125a can be assigned a higher weight as compared to the error signal corresponding to the monitor 125b.

Using multiple monitors to monitor on-chip conditions can have several advantages. For example, by monitoring the on-chip conditions at various locations, the operating voltage can be precisely controlled, which in turn results in increased power savings. Further, susceptibility to inaccurate operating voltage selection can be reduced by avoiding reliance on a single monitor. Using error signals from multiple monitors in a weighted combination has an averaging effect. Even if a particular monitor malfunctions or otherwise provides an incorrect feedback, the resulting undesirable effects may be reduced due to the averaging.

In some implementations, error signals corresponding to the multiple monitors 125 can be weighted, for example, based on the abilities of the monitors 125 to track the performance of the processor. In such cases, one or more monitors that provide more accurate or reliable information on the performance of the processor under a given set of operating conditions may be assigned higher weights than some other monitors under those conditions. The weights are assigned such that the weighted error signals corresponding to the one or more monitors provide an accurate estimate of the performance of the processor.

During operation of the processor, one or more parameters related to on-chip conditions can vary, which in turn affects the performance of the processor. Such parameters can include, for example, circuit frequency, voltage, and temperature. Under a given set of operating conditions, the one or more monitors 125 may track or estimate the performance of the processor more accurately than the others, for example, due to different response characteristics, and/or locations within the integrated circuit. If the performance of the processor is affected due to a rise in temperature at a particular location, a monitor that is disposed close to that particular location may provide a better estimate of the processor performance than another monitor which is located farther away from that particular location. In such cases, the error signal corresponding to the monitor that is closer to the particular location may be assigned a higher weight in calculating a combined error signal. In another example, error signals corresponding to one or more monitors may be assigned a higher weight than others if the frequency response characteristics of the one or more monitors are more suitable for a given frequency or frequency range.

Figure 10A:
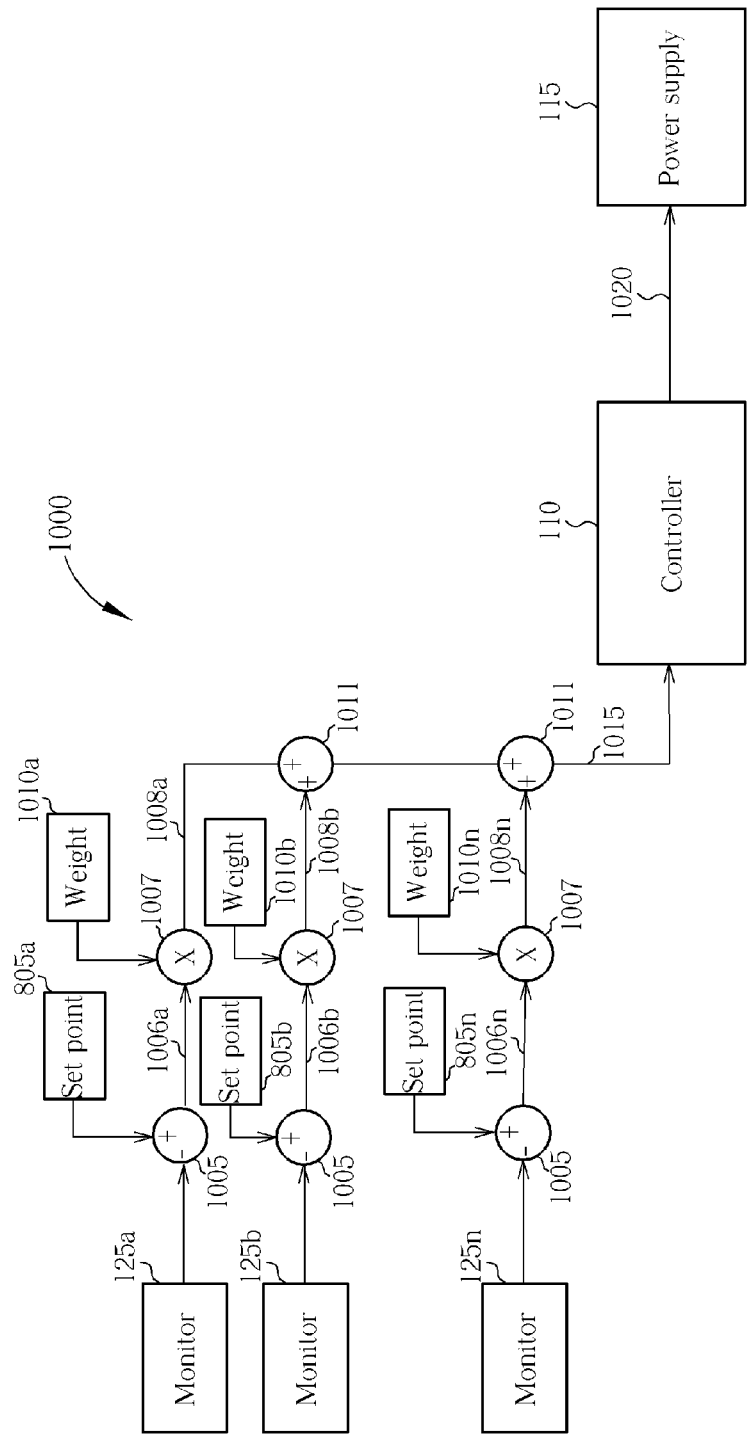
FIGS. 10A-10B are block diagrams of example systems that include multiple hardware performance monitors.

FIG. 10A shows an example of a system 1000 that includes multiple monitors 125 within an adaptive voltage scaling system. The system 1000 includes adder circuits 1005, each corresponding to one monitor 125. The monitors can be disposed in a processor, for example, as described above with reference to FIG. 1. Even though FIG. 10A shows multiple monitors 125a, 125b, . . . , 125n, in some implementations, the system 1000 can have only two monitors 125a and 125b. The adder circuits 1005 are configured to subtract the feedback signals provided by the corresponding monitors 125a, 125b, . . . , 125n from the corresponding set points 805a, 805b, . . . , 805n, respectively, to provide error signals 1006a, 1006b, . . . , 1006n (1006, in general). If the monitors 125 measure or emulate circuit delays of critical paths, the set point values 805 can be circuit delay values. If the monitors 125 include ring oscillators and measure oscillation frequencies, the correspondingly set point values can be oscillation frequency values.

The error signals 1006 can be multiplied (for example, using multipliers 1007) with corresponding weights 1010a, 1010b, . . . , 1010n (1010, in general), respectively to provide scaled error signals 1008a, 1008b, . . . , 1008n, respectively. The scaled errors can be added together, for example, using the adder circuits 1011 to provide a combined error signal 1015 to the controller 110. The controller 110 uses the combined error signal 1015 to generate a control signal 1020 that controls a supply voltage from the power supply 115. The controller 110 controls the power supply such that the combined error signal 1015 is reduced. In some implementations, the controller 110 controls the power supply 115 as described above with reference to FIG. 1.

The weights 1010 can be assigned in various ways. In some implementations, a monitor that indicates that a corresponding critical path is close to timing failure is assigned a higher weight than another monitor that indicates an available margin before timing failure. For example, if the feedback from a particular monitor is substantially or almost equal to the corresponding set point, this can indicate that the corresponding critical path is close to timing failure. Such a monitor may be referred to as a type-A monitor. If the feedback signal from a monitor differs from the set point by a threshold amount or more, this can indicate that the corresponding critical path is not close to timing failure and such a monitor may be referred to as a type-B monitor. In some implementations, the type-A monitors are dynamically assigned higher weights than type-B monitors. In such cases, potentially threatening conditions that may lead to timing failure are addressed with a higher priority. In some implementations, the weight assigned to a particular monitor can have an inverse relationship with the amount of margin available before a potential timing failure. In some implementations, type-B monitors are assigned zero weights.

In some implementations, the type-A monitors can be sampled more often than type-B monitors. For example, the controller 110 can obtain the individual feedback signals and/or error signals from the different monitors 125 and determine whether a particular monitor is a critical or type-B monitor. The type-B monitors can then be sampled at a lower rate than the critical sensors. In some implementations, the sampling frequency of a particular sensor can be determined by the controller 110 based on, for example, a magnitude of the error signal, a rate of change of the error signal, or a combination of the above. Such variable sampling rate for the different monitors can reduce usage of the bus 135 in the system 100. In some implementations, monitors can also be sampled based on operating conditions. For example, the controller 110 can be configured to sample different monitors at different operating frequencies.

In some implementations, the weights 1010 are pre-determined (for example, based on the location of the corresponding monitors) and stored in memory locations such as registers. In some implementations, the weights can be provided by the controller 110. The weights can also be obtained from a LUT 140 that can be configured to store sets of weight values and preset parameter values corresponding to various on-chip conditions. The preset parameters can be substantially the same as the set points 805 described above, and one or more of the weights and the preset parameter values can vary from one frequency range to another. For example, when the data processor operates at a first frequency or frequency range, a first set of weights and a first set of preset parameter values can be used. When the data processor operates at the second frequency or frequency range, a second set of weights and a second set of parameter values can be used.

The controller 110 can also be configured to adaptively change the weights based on, for example, monitoring the feedback provided by the different monitors. For example, if one of the monitors is determined to be providing an outlier value as compared to other monitors, the controller 110 can be configured to ignore that monitor by setting the corresponding weight to zero or a low value. In some implementations, the system 1000 can include circuitry (e.g. a logic circuit) to assign or select the weights 1010.

In some implementations, the weights 1010 are assigned such that the sum of the individual weights is substantially equal to unity. For example, if there are three monitors and two of the monitors are assigned weights 0.3 and 0.2, respectively, the third monitor can be assigned a weight of 0.5. In some implementations, the weights 1010 are assigned such that the combined error signal is an average of the individual error signals 1006. This can be done by setting the weights 1010 substantially equal to each other and such that the weights 1010 add up to unity. For example, if there are four monitors, each of the weights can be set as 0.25 so that the combined error signal 1015 will be an average of the individual error signals 1006.

Figure 10B:
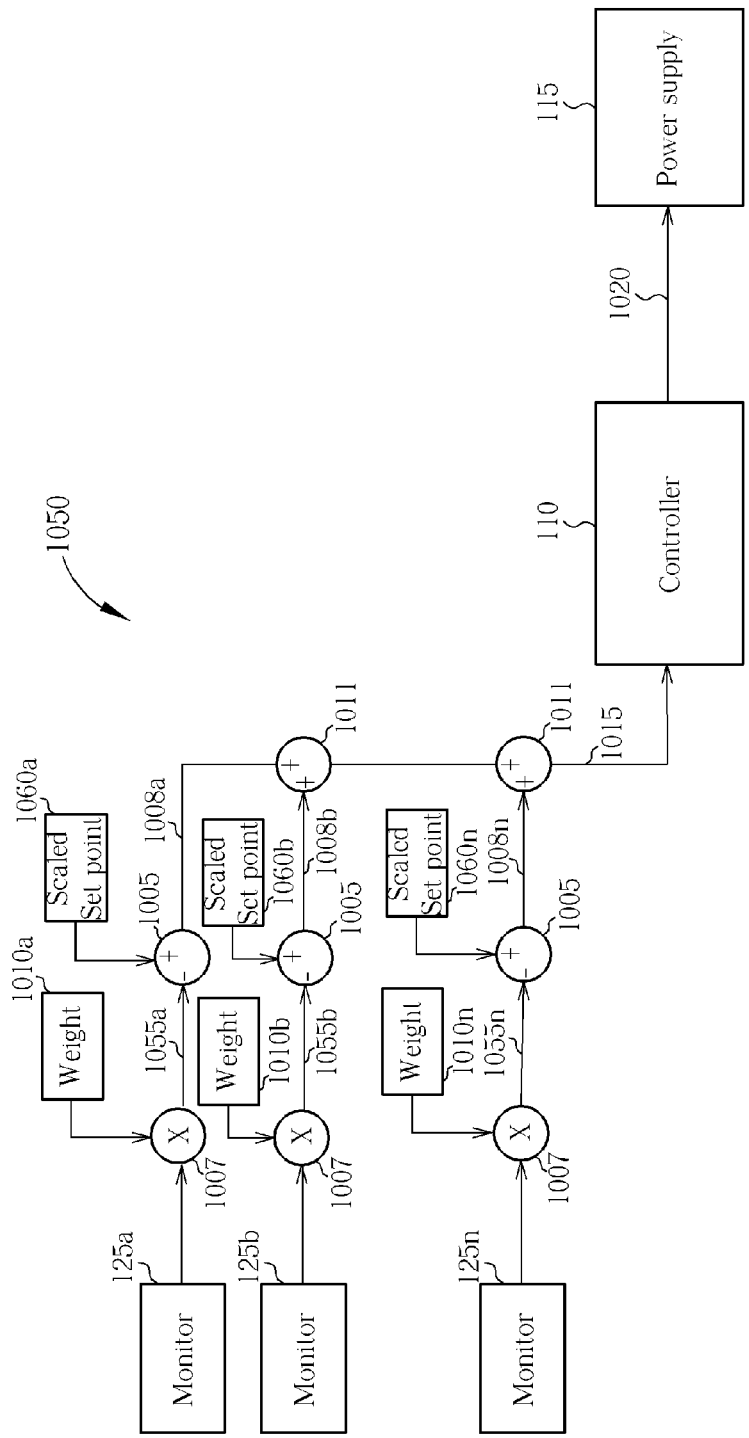

FIG. 10A illustrates an example system 1000 where the error signals (i.e. the deviations of the feedback signals from the corresponding set points) are scaled or weighted. In some implementations, the weights can be applied to the feedback signals. FIG. 10B shows an example of such a system 1050. In the system 1050, the feedback signals are multiplied (for example, using multipliers 1007) to provide weighted feedback signals $1055a$, $1055b$, ..., $1055n$ (1055, in general). In such cases, the corresponding set points may also need to be adjusted to provide scaled set points $1060a$, $1060b$, ..., $1060n$ (1060, in general). In some implementations, the set points are correspondingly scaled using a substantially same weight $1010a$ to provide the scaled set points 1060. The weighted feedback signals 1055 are then subtracted from the corresponding scaled set points 1060 to obtain the scaled errors 1008. The scaled errors can be added together, for example, using the adder circuits 1011 to provide the combined error signal 1015 to the controller 110.

Figure 11A:
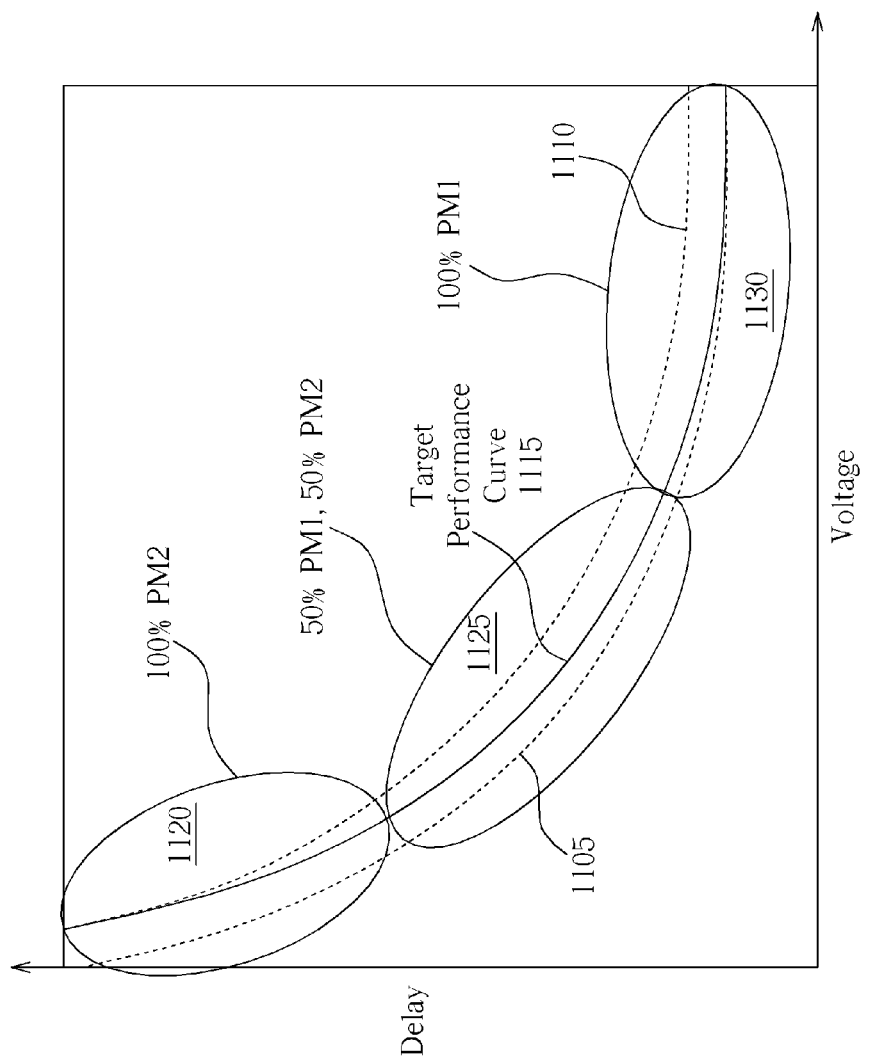
FIGS. 11A and 11B are plots of voltage vs. timing delay curves.

An example of choosing weights corresponding to different monitors is illustrated in FIG. 11A, which shows voltage vs. timing delay curves for a particular critical path in an integrated circuit that uses two performance monitors PM1 and PM2. The voltage in the graph refers to the voltage provided by a power supply to the integrated circuit and the performance monitors, and the timing delay indicates the amount of time needed for a signal to propagate through the critical path for different power supply voltages. The plot 1115 shows the target performance curve and the plots 1105 and 1110 represent the performances that can be achieved using only monitors PM1 and PM2, respectively. The plot 1115 indicates that the timing delay is reduced as the power supply voltage is increased. In region 1120, the curve 1110 is closer to the target performance curve 1115 as compared to the curve 1105. On the other hand, in region 1130, the curve 1105 is closer to the target performance curve 1115 as compared to the curve 1110. These indicate that in region 1120, a performance within an acceptable range of the target performance can be achieved by using feedback from only monitor PM2; and in region 1130, a performance within an acceptable range of the target performance can be achieved using feedback from only monitor PM1. Accordingly, in this example, for operating conditions falling under the region 1120, the weights assigned to error signals corresponding to monitors PM1 and PM2 are 0 and 1, respectively. For operating conditions falling under the region 1130, the corresponding weights for monitors PM1 and PM2 are 1 and 0, respectively. In the region 1125, the curves 1105 and 1110 are on two sides of the target performance curve 1115 and for most parts, at similar (or substantially the same) distance away from the target performance curve 1115. Therefore, for operating conditions falling under the region 1125, the weights assigned to error signals corresponding to monitors PM1 and PM2 are 0.5 and 0.5, respectively.

In some implementations, a subset of monitors can be selected from a higher number of available monitors for a given critical path and the weights for the selected subset of monitors can be determined based on the corresponding performance curves or equations. For example, if ten available monitors are distributed near the processor core and the peripheral region, the ones closer to the core would likely have worse IR drops than the ones on the periphery. For a high current scenario the monitors in the peripheral region can be ignored or masked and the weights determined for a smaller number (for example, three) of monitors.

Figure 11B:
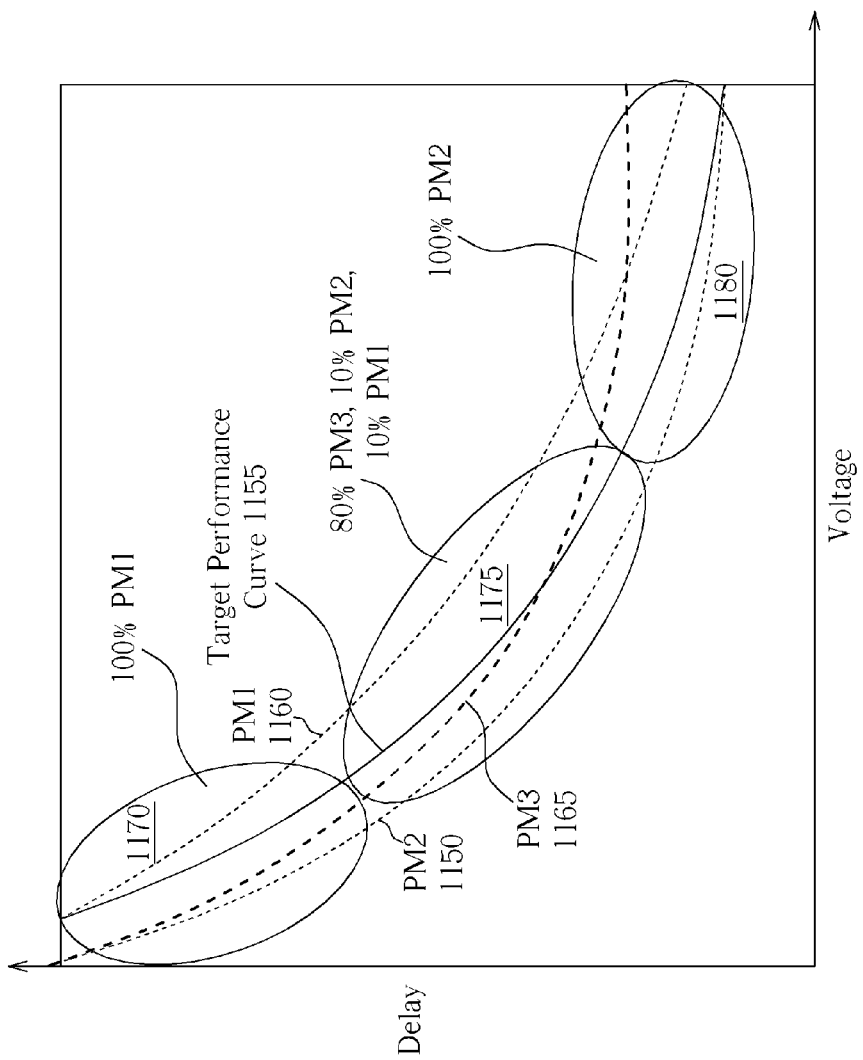

FIG. 11B illustrates another example of choosing weights corresponding to different monitors. In this case, three monitors PM1, PM2, and PM3 are used and the corresponding curves are 1160, 1150, and 1165, respectively. The target performance in this case is represented by the curve 1155. Similar to the example of FIG. 11A, three separate regions 1170, 1175 and 1180 are identified and based on the location of the curves relative to one another as well as to the target performance curve 1155, the weights in the different regions are determined. For operating conditions falling under the region 1170, the weights assigned to error signals corresponding to monitors PM1, PM2 and PM3 are 1, 0, and 0, respectively. For operating conditions falling under the region 1175, the corresponding weights for monitors PM1, PM2 and PM3 are 0.1, 0.1 and 0.8, respectively. For operating conditions falling under the region 1180, the weights assigned to error signals corresponding to monitors PM1, PM2 and PM3 are 0, 1 and 0, respectively.

It should be noted that the target performance curve 1115 and the curves 1105 and 1110 are for illustrative purposes and should not be considered limiting. Other performance curves that represent a relationship between the supply voltage and delay associated with a given critical path can also be used without deviating from the scope of this application. The performance curves can also vary with temperature. In such cases, a representative curve can be used for selecting the monitors. For example, the temperature variations can be quantized into discrete bins and the monitor selection can be based on a worst case delay curve for the given frequency range.

Interrupt Driven Communications Between Monitors and Controller

Referring again to FIG. 1, in some implementations, the controller 110 intermittently polls the monitors 125 and controls the voltage regulator 114 accordingly to adjust the supply voltage 117 from the power supply 115. The communication between the monitors 125 and the controller 110 can be facilitated by the bus 135. However, in such a polling based scheme, the bus 135 has to be used frequently and therefore bus bandwidth available for other communications can be reduced. Polling the monitors frequently may result in wasted power and bus bandwidth. On the other hand, sampling the monitors 125 infrequently can lead to missed events and potential system instability. Further, a latency of the voltage scaling system 100 (i.e., a time between an event and a corresponding voltage adjustment) can also be high due to, for example, access times needed to sample the monitors 125. The sampling frequency can also be limited by, for example, a frequency range supported by the bus 135 (often referred to as a bus-frequency).

Figure 12:
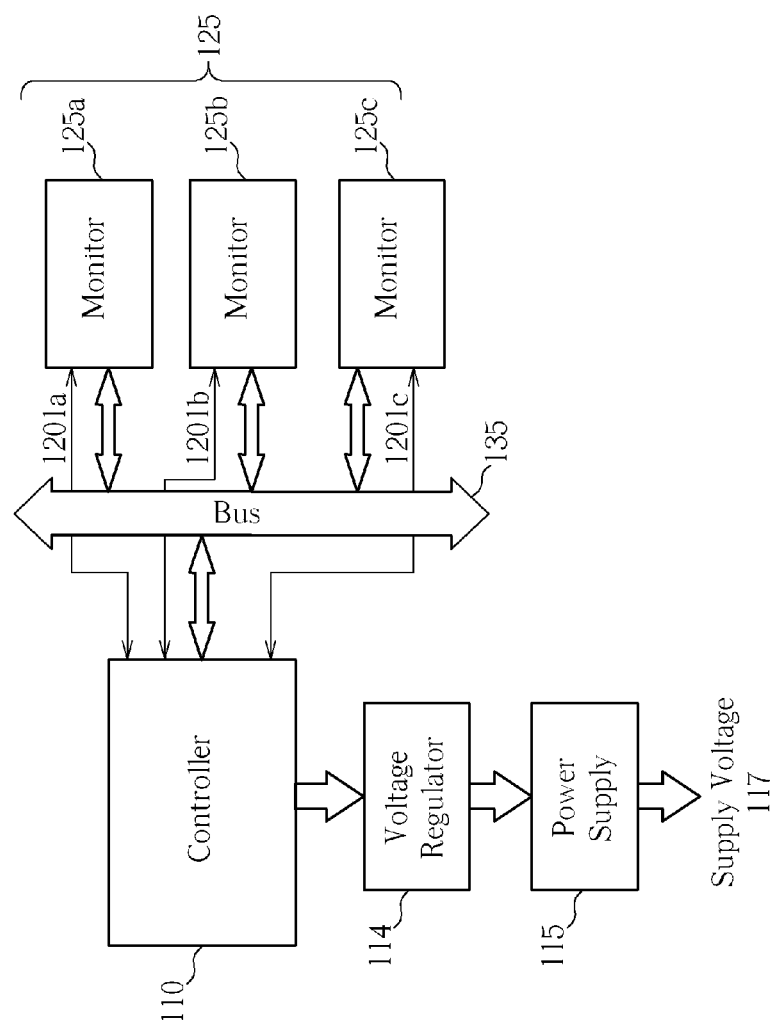
FIG. 12 is a block diagram of an example interrupt-based adaptive voltage scaling system.

FIG. 12 is a block diagram that illustrates an example system of communication between the controller 110 and the monitors 125. In some implementations, to reduce the number of times that the controller 110 has to poll the monitors 125 and thereby reducing usage of the bus 135 by the voltage scaling system 100, the monitors 125 can be configured to check if the system 100 is operating at or near the set point (for example, by measuring a parameter). The monitors 125 can then process the measured parameter and issue an interrupt using dedicated interrupt lines 1201a, 1201b, 1201c (1201, in general). Because the monitors 125 process the measured parameters and issue interrupt signals to the controller 110 only when needed, the controller 110 does not have to periodically poll the monitors 125, thereby reducing usage of the bus 135 and associated latency. The interrupt lines 1201 can include one or more signal lines configured to carry one or more bits as the interrupt signal. When an interrupt is received at the controller 110 from a monitor 125, the controller 110 adjusts the supply voltage 117 from the power supply 115, for example, using a voltage regulator 114.

The monitors 125 can check whether the system 100 is operating at or near the set point is various ways. In some implementations, the monitors 125 can be configured to calculate a difference between the set point and the measured parameter and determine whether the difference is within a predefined tolerance limit. The monitors 125 can also be configured to issue an interrupt signal on the corresponding interrupt lines 1201 if the difference is determined to be outside the predefined tolerance limit. The tolerance limits and set points can be pre-stored in the monitors 125, for example, when occurrence of an event triggers a change in the set point. The controller 110 can be configured to store the set points and the corresponding tolerance limits in the monitors 125 using the bus 135.

In some implementations, the monitors 125 can be configured to issue an interrupt if the measured parameter value itself is above an upper threshold or below a lower threshold. In such cases, the controller 110 can be configured to program or store the set point (such as represented by the curve 920 in FIG. 9A) and the one or more associated thresholds in the monitor 125. This can be done, for example, when occurrence of an event triggers a change in the set point. The controller 110 can configure or program the monitors 125 with the set point and/or the upper and lower thresholds using, for example, the bus 135. In some implementations, a plurality of high and/or low thresholds can be associated with a set point. In such cases, multiple bit signals can be issued on the interrupt lines 1201 to represent, for example, which level of threshold has been breached. For example, a given set point may have four associated thresholds, namely, critical low, non-critical low, non-critical high and critical high. These four thresholds can be represented using a two bit interrupt signals as the bit patterns "00", "01", "10", and "11", respectively.

The monitors 125 typically measure the parameter at a frequency that is higher than a frequency at which the controller 110 is able to repeatedly adjust the supply voltage 117 from the power supply 115. The high sampling rate can ensure that adjustments are made as often as allowed by the capability of the controller 110. However, in some implementations, the monitors 125 may measure the parameter at a frequency lower than that at which the controller 110 is able to repeatedly adjust the power supply output voltage level. This can be done, for example, when power savings due to the low sampling rate outweighs the advantage of frequent adjustments. In some implementations, the sampling rate of the monitors can be made adjustable. The sampling rate can also be determined based on the capability of the power supply 115 to respond to an adjustment.

When the occurrence of an event triggers a change in the set-point, the new set-point can be obtained from the LUT 140. The LUT 140 can be configured to store the set-points for various conditions, including, for example, various clock frequencies, supply voltage drops, temperatures, silicon age, or process skew. The set-point can represent a desired or expected value of the parameter measured by the monitor under a given set of conditions.

In some implementations, when multiple monitors are used in a system, the outputs from the various monitors can be averaged or otherwise weighted and the averaged or weighted value is compared to a corresponding threshold to determine if an interrupt should be sent to the controller. In some implementations, some monitors can be categorized as more important than the others such that when a threshold in crossed for an important monitor, an interrupt is issued for the controller regardless of whether the weighted or averaged value across all monitors is within the corresponding thresholds. In some implementations, the controller 110 may receive multiple interrupt signals from a plurality of monitors 125. In such cases, the controller 110 can either prioritize servicing the interrupts (for example, based on when the interrupts are received, an importance of the corresponding monitors and/or the level of threshold breached), or combine information from each of the plurality of monitors 125 in responding to the interrupts. For example, the controller 110 can query each of the plurality of monitors 125 to obtain measurements of the parameters from the monitors, and adjusts the supply voltage 117 according to the measurement values. In some implementations, one or more monitors can be determined to be unimportant and be masked out, for example, using software. In such cases, interrupts from the masked out monitors can be ignored by the controller 110.

The monitor 125 can include circuitry (for example, a comparator) that compares the monitor reading with the stored set points and/or thresholds. If the monitor reading is within the threshold(s) of the stored set point, the controller is not interrupted. However, if the monitor reading is outside the threshold, the monitor 125 sends an interrupt signal to the controller 110. The controller 110 services the interrupt and adjusts the supply voltage of the power supply 115. In some implementations, the controller 110 polls the monitors 125 upon receiving the interrupt for a measured value and controls the power supply 115 accordingly. In such cases, the controller 110 calculates an amount of voltage reduction (or increase) based at least in part on the measurement value, and adjusts the power supply 115 to reduce (or increase) the supply voltage 117 by the calculated amount.

In some implementations, the interrupt signal can be configured to include information on what kind of adjustments are needed and the controller 110 proceeds to adjust the power supply 115 accordingly. For example, the interrupt signal can be sent to the controller 110 over a two-bit signal line in which the first bit denotes whether a positive or negative change is needed and the remaining bit denotes two different levels of change. In another example, the interrupt signal can be sent to the controller 110 over a three-bit signal line wherein the first bit denotes whether a positive or negative change is needed and the remaining two bits denote four different levels of change In such cases, the controller 110 can be configured to increase or decrease the supply voltage by a predetermined amount when an interrupt signal is received. Such interrupt-based adaptive voltage schemes can be referred to as offline control schemes.

The offline control scheme outlined above can offer several advantages. For example, usage of bus-bandwidth for communications between the controller 110 and the monitors 125 can be reduced. In some cases, when dedicated interrupt lines are used between the controller and the monitors, usage of the bus 135 for communications between the controller 110 and the monitors 125 can be substantially reduced when the set point is unchanged. This can reduce the load on the bus 135 and free up the bus-bandwidth for potential use by other intra-processor communications or other communications between the controller 110 and the processor 105. By avoiding bus access and computations by the controller, the latency can also be improved. The offline control scheme can also provide an increased immunity to arbitration artifacts associated with bus accesses. Arbitration artifacts can arise in situations where a different portion of the system 100 has a higher bus priority than the controller 110. In such cases, the controller 110 may not have adequate access to the bus 135 to monitor the sensors 130 as often as needed. This in turn could reduce power efficiency as well as increase the chances of missing an event that makes the system unstable. The offline control scheme can provide immunity to such arbitration artifacts by reducing or avoiding bus accesses. Power usage is also reduced due to reduced communications between the controller 110 and the monitors 125. Further, the offline scheme allows for a wider selection of sensor sampling frequencies because the choice is no longer restricted by the bus frequency. The offline scheme also allows more versatility by using interrupts to margining requirements. For example, consider the case where the monitors are sampled at a fast rate and one of the thresholds are violated at a rate higher than what the controller 110 can react to. In such cases, the system can be made stable by increasing the margins till the frequency of the interrupt drops. Thus by using offline interrupts the system can be adaptively margined to ensure that events with frequency outside the loop bandwidth are also covered.

Figure 13:
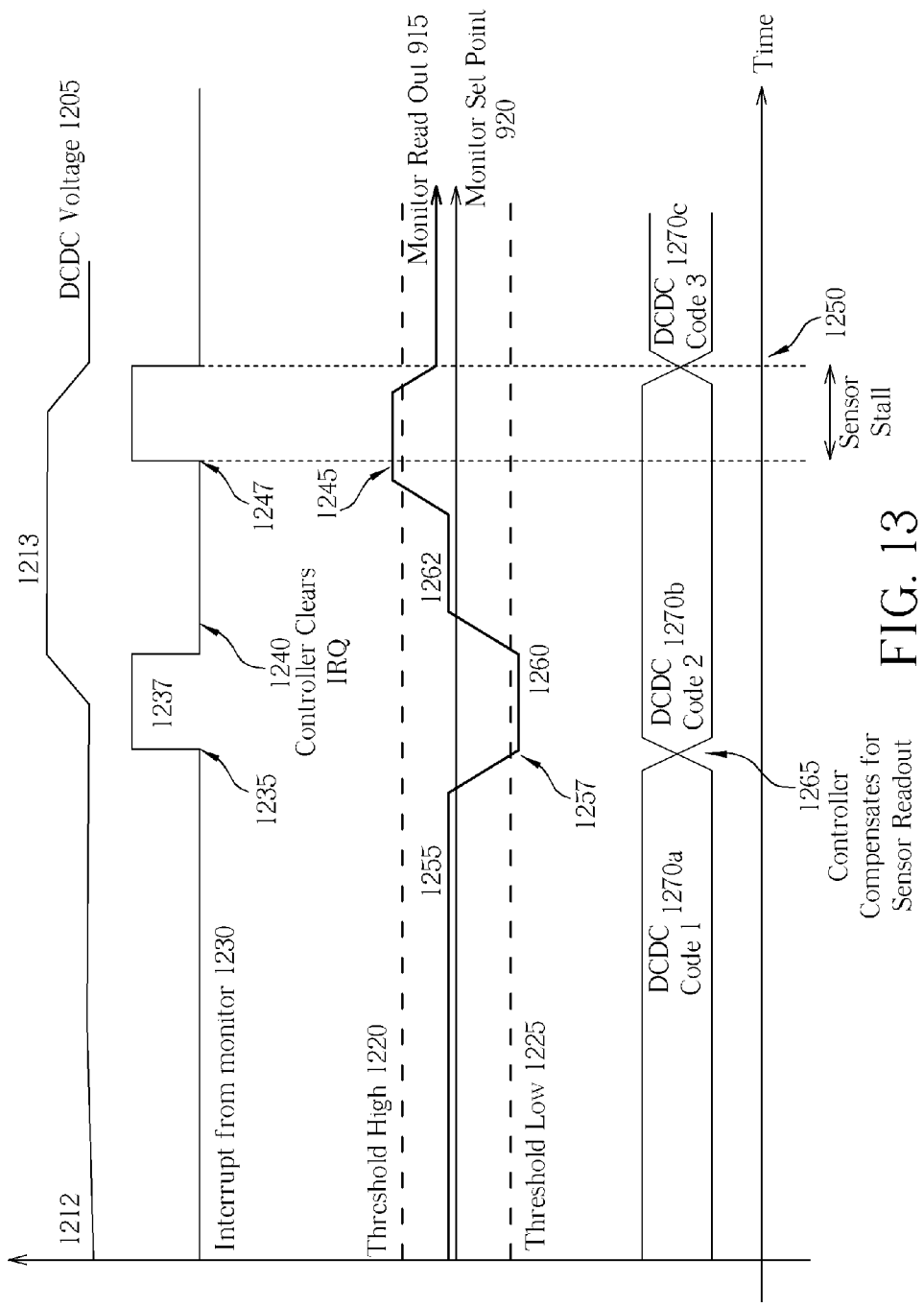
FIG. 13 shows example timing diagrams of signals in an interrupt-based adaptive voltage scaling system.

FIG. 13 shows example timing diagrams of signals in an offline control scheme in an adaptive voltage scaling system. The curve 1205 represents the supply voltage 117 (referred to in FIG. 13 as the DC DC voltage) from the power supply 115. The curve 920 represents the set point 805 (FIG. 8) for a particular monitor 125 and the curve 915 represents the readout of the particular monitor 125. In the example shown, the monitor readout is initially at a level 1255. Because the monitor readout is in the region between the upper threshold 1220 and the lower threshold 1225, the interrupt signal curve 1230 is low, indicating the monitor 125 does not issue any interrupts. At time point 1257, the sensor readout changes by an amount that causes the sensor readout curve 915 to dip to a level 1260 which is below the lower threshold 1225. This causes the monitor 125 to issue an interrupt signal at the time point 1235. This is illustrated as a pulse 1237. The pulse 1237 can be transmitted to an interrupt pin (for example, IRQ) of the controller 110.

The controller 110 services the interrupt and adjusts the supply voltage of the power supply 115. In some implementations, the controller 110 queries the monitor 125 to obtain a measurement of a parameter measured by the monitor 125 and controls the power supply to adjust the output voltage level according to the measurement value. The parameter can be associated with a critical path that the monitor 125 is configured to emulate. For example, the parameter can be a circuit delay associated with the critical path and the controller controls the supply voltage 117 to reduce a difference between the measured circuit delay and a preset circuit delay value. In another example, the parameter can be an oscillation frequency of a ring oscillator, and the controller 110 controls the supply voltage 117 to reduce a difference between a measured oscillation frequency and a preset oscillation frequency value. In another example, the parameter can be a timing margin, and the controller controls the power supply output voltage level to adjust the timing margin to within a specified range.

In the example of FIG. 13, the controller 110 compensates for the monitor readout by changing the adjustment code 1270a to adjustment code 1270b. The difference in time between the points 1235 and 1265 represents a latency due to the controller 110. This causes the supply voltage to increase and the voltage curve 1205 rises from a level 1212 to an increased level 1213. The sensor readout also increases accordingly from the level 1260 to a level 1262 that is within the upper threshold 1220 and lower threshold 1225. The controller 110 can wait for a period of time to allow the system 100 to stabilize and clear the interrupt pin (such as the IRQ) at a time point 1240. The monitor can remain 'stalled' or suspended during the duration of the pulse 1237.

In the current example, the sensor readout crosses the upper threshold at a time point 1245 and accordingly the monitor 125 issues an interrupt at a time point 1247. In response, the controller 110 services the interrupt and at a time point 1250, changes the adjustment code from 1270b to 1270c. In the time period between the time points 1247 and

1250, the monitor samples are not needed or used because the supply voltage is not changed yet. In some implementations, the clocks to the monitors can be gated such that the monitors or sensors are 'stalled.' The monitor can therefore again remain suspended between the time points 1247 and 1250. The controller changing the voltage code causes the supply voltage to decrease and the sensor readout comes down to a level between the upper threshold 1220 and the lower threshold 1225.

Figure 14:
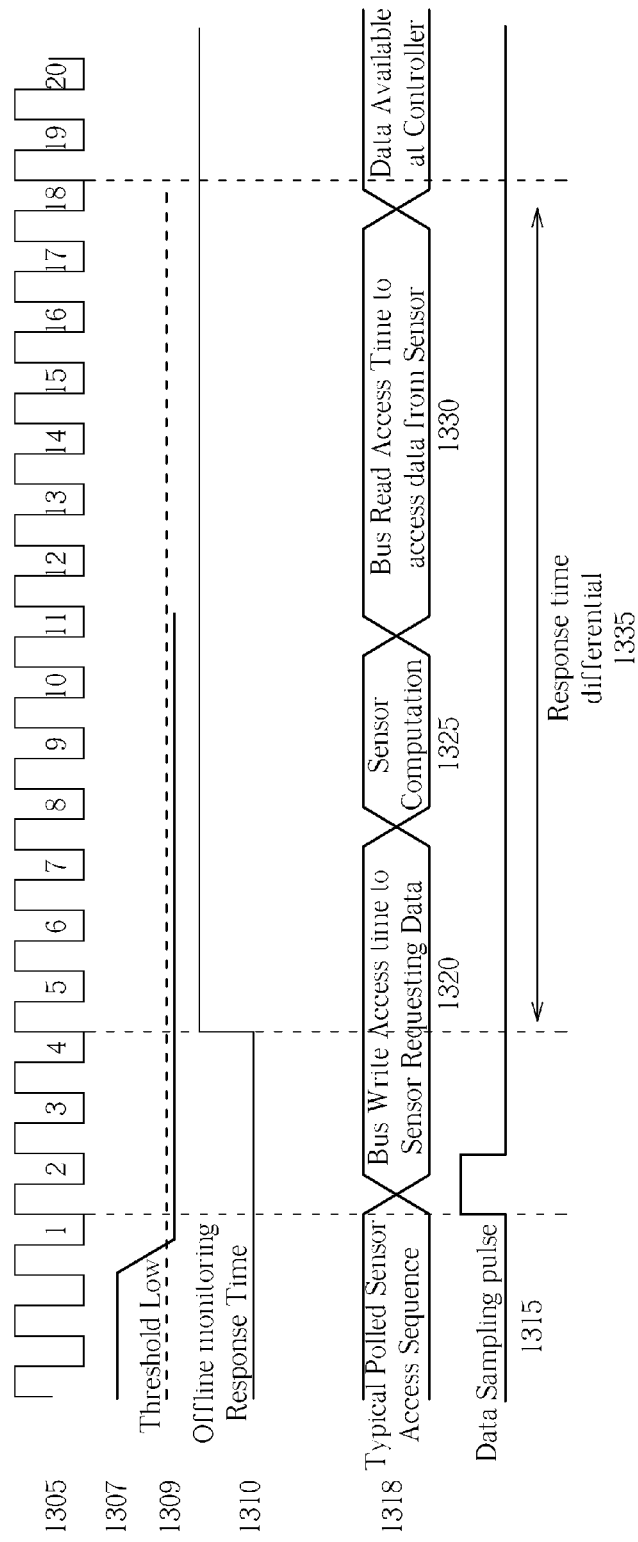
FIG. 14 shows plots that compare an interrupt-based system with a polling based system for adaptive voltage scaling.

FIG. 14 shows example plots that compare a system where the adjustment information is included in the interrupt signal with a polling based system for adaptive voltage scaling. The polling based system can be a continuous polling system wherein the controller 110 periodically polls one or more monitors 125 or an interrupt driven system where the controller 110 polls one or more monitors in response to receiving an interrupt. The plot 1305 represents a clock sequence, including clock cycles 1 to 20. The plot 1307 represents monitor readout values. The plot 1309 represents a lower threshold associated with the monitor. The plot 1310 represents the response time in an offline control system. In this example, the monitor readout 1307 decreases to a level that is lower than the lower threshold 1309 during clock cycle 1. This triggers an interrupt to the controller 110 and an interrupt is received at the controller 110 during clock cycle 4. This is represented by a transition of the plot 1310 from logic "low" to logic "high." The information needed by the controller 110 to control the power supply 115 is therefore available at the controller during clock cycle 4 when the information is included in the interrupt signal itself.

The plot 1318 represents a timing diagram when a polling-based system is used. In this system, a data sampling pulse 1315 is issued by the controller 110 at the rising edge of the clock cycle 1 to sample a monitor 125. Sampling the monitor 125 can include several steps each of which requires a period of time to be executed. For example, a time period 1320 is needed for write access to the bus 135 in order to request data from a monitor 125. The time period 1325 is needed by the monitor 125 to compute the requested data and provide the data on the bus 135. The time period 1330 is needed for the controller 110 to access the bus 135 again to read the data provided by the monitor 125. The response time (or the time duration from the beginning of the sampling pulse to the time point at which sensor measurement data is available at the controller) in the polling-based system is a sum of the time periods 1320, 1325 and 1330. In this example, the response time is eighteen clock cycles. The response time in a system where the adjustment information is included in the interrupt signal itself is typically lower than the response time for a polling-based system. The difference in response time is represented by the time period 1335, which in this example, is substantially equal to fourteen clock cycles.

Overview of a Computing Device

Figure 15:
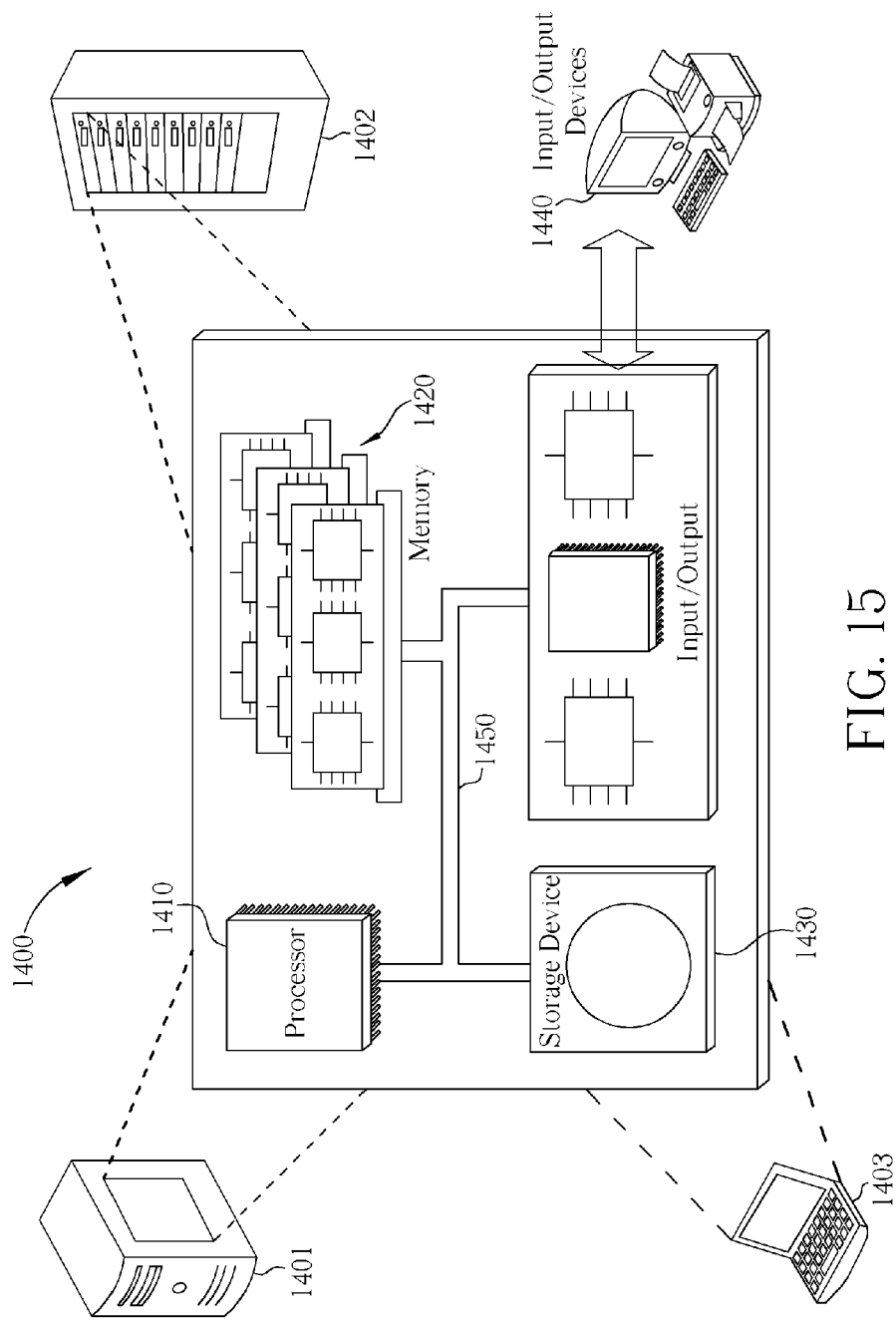
FIG. 15 is a block diagram of a computing device.

FIG. 15 is a schematic diagram of a computer system 1400. The system 1400 can be used for the operations described in association with any of the computer-implemented methods described above, such as the process 700 for initializing and calibrating a critical path emulator. The system 1400 can be incorporated in various computing devices such as a desktop computer 1401, server 1402, and/or a mobile device 1403 such as a laptop computer, mobile phone, tablet computer or electronic reader device. The system 1400 includes a processor 1410, a memory 1420, a storage device 1430, and an input/output device 1440. Each of the components 1410, 1420, 1430, and 1440 are interconnected using a system bus 1450. The processor 1410 is capable of processing instructions for execution within the system 1400. In one implementation, the processor 1410 is a single-threaded processor. In another implementation, the processor 1410 is a multi-threaded processor. The processor 1410 is capable of processing instructions stored in the memory 1420 or on the storage device 1430 to display graphical information for a user interface on the input/output device 1440. In some implementations, the processor 1410 is a mobile processor that is designed to save power. The processor 1410 can be substantially similar to the processor 105 described above with reference to FIG. 1, and various voltage scaling techniques described above for reducing power consumption by the processor 105 can be applied to the processor 1410.

The memory 1420 stores information within the system 1400. In some implementations, the memory 1420 is a computer-readable storage medium. The memory 1420 can include volatile memory and/or non-volatile memory. The storage device 1430 is capable of providing mass storage for the system 1400. In one implementation, the storage device 1430 is a computer-readable medium. In various different implementations, the storage device 1430 may be a floppy disk device, a hard disk device, an optical disk device, or a tape device.

The input/output device 1440 provides input/output operations for the system 1400. In some implementations, the input/output device 1440 includes a keyboard and/or pointing device. In some implementations, the input/output device 1440 includes a display unit for displaying graphical user interfaces. In some implementations the input/output device can be configured to accept verbal (e.g. spoken) inputs.

The features described can be implemented in digital electronic circuitry, or in computer hardware, firmware, or in combinations of these. The features can be implemented in a computer program product tangibly embodied in an information carrier, e.g., in a machine-readable storage device, for execution by a programmable processor; and features can be performed by a programmable processor executing a program of instructions to perform functions of the described implementations by operating on input data and generating output. The described features can be implemented in one or more computer programs that are executable on a programmable system including at least one programmable processor coupled to receive data and instructions from, and to transmit data and instructions to, a data storage system, at least one input device, and at least one output device. A computer program includes a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. Computers include a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube), LCD (liquid crystal display) monitor, e-Ink display or another type of display for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

The processor 1410 carries out instructions related to a computer program. The processor 1410 may include hardware such as logic gates, adders, multipliers and counters. The processor 1410 may further include a separate arithmetic logic unit (ALU) that performs arithmetic and logical operations.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. For example, the controller 110 can be a part of the processor core or MCU 120 that also performs other tasks unrelated to the power management operations.

Accordingly, other implementations are within the scope of the following claims.

What is claimed is:

1. An apparatus comprising:
  a configurable delay circuit comprising a plurality of delay elements;
  a lookup table having information for configuring the delay circuit based on one or more conditions;
  a controller to configure the delay circuit according to the information in the lookup table; and
  a sampling circuit to sample outputs of each of a subset of the delay elements and generate a multi-bit delay signal providing information about an amount of delay caused by the delay elements to an input signal propagating through the configurable delay circuit, each bit in the multi-bit delay signal indicating whether the input signal has propagated through a corresponding delay element.

2. The apparatus of claim 1 in which the configurable delay circuit emulates at least one critical path in a data processor.

3. The apparatus of claim 1 in which the sampling circuit comprises sampling elements that are associated with the subset of the delay elements, each sampling element corresponding to one of the delay elements in the subset, the multi-bit delay signal being generated based on the outputs of the sampling elements.

4. The apparatus of claim 3, comprising
  a power supply to provide power to the configurable delay circuit, and
  a voltage regulator to regulate a voltage level provided by the power supply,
  in which the controller controls the voltage regulator to regulate the power supply voltage level according to the multi-bit delay signal.

5. The apparatus of claim 4 in which the sampling circuit samples the output of the subset of delay elements at a sampling time point, and the controller controls the voltage regulator to regulate the power supply voltage level such that the input signal propagates through approximately half of the subset of the delay elements at the sampling time point.

6. The apparatus of claim 5 in which the controller controls the voltage regulator to regulate the power supply voltage level such that approximately half of the bits in the multi-bit signal is 1 and half of the bits in the multi-bit signal is 0 at the sampling time point.

7. The apparatus of claim 6 in which the sampling circuit comprises latches to latch the output of the subset of the delay elements, the latches operate according to a clock signal, and the sampling time point corresponds to an edge of the clock signal.

8. The apparatus of claim 1, comprising a power supply to provide power to the configurable delay circuit, in which the controller controls an output voltage level of the power supply according to the multi-bit delay signal provided by the sampling circuit.

9. The apparatus of claim 1, comprising
  a data processor;
  a power supply to provide power to the data processor and the configurable delay circuit;
  a voltage regulator to regulate a voltage level provided by the power supply;
  wherein the look-up table also has target voltage values each corresponding to one or more conditions, and
    the controller at various time points controls the voltage regulator based on target voltage values obtained from the look-up table, and in between the time points, the controller controls the voltage regulator based on multi-bit delay signals provided by the sampling circuit.

10. The apparatus of claim 1 in which each of the plurality of logic elements comprises at least one of an AND gate, an OR gate, a NAND gate, a NOR gate, an XOR gate, a multiplexer, an inverter, or a logic circuit comprising at least two logic gates.

11. The apparatus of claim 1 in which the configurable delay circuit comprises multiplexers to select combinations of logic gates, and the lookup table has information for configuring the multiplexers for various conditions.

12. An apparatus comprising:
  a data processor;
  a configurable delay circuit comprising a plurality of delay elements, different combinations of the delay elements representing different delay paths in the configurable delay circuit;

a sampling circuit to sample outputs of each of a subset of the delay elements and generate multi-bit delay signals providing information about delays caused by the delay elements to input signals propagating through the configurable delay circuit; and a calibration module to evaluate each of a plurality of combinations of the delay elements based on the multi-bit delay signals and identify one or more combinations of the delay elements for emulating one or more critical paths of the data processor at various conditions.

13. The apparatus of claim 12 in which the sampling circuit comprises sampling elements that are associated with the subset of the delay elements, each sampling element corresponding to one of the delay elements in the subset, the outputs of the sampling elements indicating which delay elements the input signal has propagated through during a sampling period, the delay signal being generated based on the output of the sampling elements.

14. The apparatus of claim 12 in which the calibration module is configured to send input signals to each of a plurality of combinations of the delay elements, gradually reducing a power supply voltage provided to the data processor and the configurable delay circuit, evaluating the outputs of the subset of the delay elements when the data processor fails, and evaluating the outputs of the subset of the delay elements at a power supply voltage level higher, by a safety margin, than the voltage level at which the data processor fails.

15. The apparatus of claim 14 in which the calibration module is configured to identify candidate combinations of the delay elements in which at the power supply voltage level higher, by the safety margin, than the voltage level at which the data processor fails, the input signal has propagated through some, but not all, of the subset of delay elements during a sampling time period.

16. The apparatus of claim 15 in which when there are more than one candidate, the calibration module is configured to identify a candidate that tracks at least one of temperature or frequency better than the other candidates.

17. The apparatus of claim 12 comprising a lookup table to store information for configuring the configurable delay circuit based on one or more conditions, the information being determined based on the evaluation performed by the calibration module.

18. An apparatus comprising:
a data processor;
a configurable delay circuit comprising a plurality of multiplexers and delay elements, different configurations of the multiplexers being associated with different delay paths that comprise different combinations of the delay elements;
a sampling circuit to sample outputs of a subset of the delay elements associated with a delay path and generate a delay signal providing information about an amount of delay caused by the delay elements to an input signal propagating through the configurable delay circuit; and
a calibration module to evaluate each delay path based on the delay signals from the sampling circuit and identify the delay paths in the configurable delay circuit for emulating critical paths of the data processor at various conditions.

19. A method comprising:
calibrating a configurable delay circuit that has a plurality of delay elements, different combinations of the delay elements representing different delay paths in the configurable delay circuit, the calibration comprising:
evaluating a plurality of delay paths, for each delay path, sending input signals through the delay path, gradually reducing a power supply voltage provided to a data processor and the calibration module until the data processor fails, and evaluating the outputs of a subset of the delay elements corresponding to the delay path when the power supply voltage is at a level that is higher, by a safety margin, than the voltage for which the data processor fails, and identify the delay path as a candidate delay path if the input signal has propagated through some but not all of the subset of delay elements during a sampling time period.

20. The method of claim 19, comprising, if there are more than one candidate delay path, identify a candidate that tracks at least one of temperature or frequency better than the other candidates.

21. The method of claim 19 in which identifying the delay path as a candidate delay path comprises identifying the delay path as a candidate delay path if approximately half of the outputs of the subset of delay elements have logic 1 state and approximately half of the outputs of the subset of delay elements have logic 0 state at the end of the sampling time period.

22. A method comprising:
configuring a configurable delay circuit according to information in a lookup table to select a combination of delay elements to form a delay path, the configurable delay circuit comprising a plurality of delay elements, the lookup table having information for configuring the configurable delay circuit for various conditions;
sampling outputs of a subset of the delay elements associated with the delay path to generate a multi-bit delay signal providing information about an amount of delay caused by the delay elements to an input signal propagating through the delay path, each bit in the multi-bit delay signal indicating whether the input signal has propagated through a corresponding delay element.

23. The method of claim 22, comprising emulating a critical path in a data processor using the delay path in the configurable delay circuit.

24. The method of claim 22, comprising regulating a power supply voltage level provided to a data processor and the configurable delay circuit according to the multi-bit delay signal.

25. The method of claim 24, in which regulating the power supply voltage level comprises regulating the power supply voltage level such that the input signal propagates through approximately half of the subset of the delay elements during a sampling time period.

26. The method of claim 24, comprising at various time points regulating the power supply voltage level based on target voltage values in a look-up table, and in between the time points, regulating the power supply voltage level based on the multi-bit delay signal.

* * * * *